United States Patent
Hsu et al.

(10) Patent No.: US 10,957,585 B2
(45) Date of Patent: Mar. 23, 2021

(54) SEMICONDUCTOR DEVICE AND METHOD OF FORMING THE SAME

(71) Applicant: TAIWAN SEMICONDUCTOR MANUFACTURING CO., LTD., Hsinchu (TW)

(72) Inventors: I-Wen Hsu, Kaohsiung (TW); Yu-Yun Peng, Hsinchu (TW); An-Di Sheu, Hsinchu (TW); Jei-Ming Chen, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/169,008

(22) Filed: Oct. 24, 2018

(65) Prior Publication Data
US 2020/0135551 A1   Apr. 30, 2020

(51) Int. Cl.
| | | |
|---|---|---|
| H01L 21/768 | (2006.01) | |
| H01L 21/762 | (2006.01) | |
| H01L 21/02 | (2006.01) | |
| H01L 21/76 | (2006.01) | |
| H01L 21/8234 | (2006.01) | |
| H01L 29/66 | (2006.01) | |
| H01L 29/78 | (2006.01) | |
| H01L 29/51 | (2006.01) | |
| H01L 29/49 | (2006.01) | |

(52) U.S. Cl.
CPC .. *H01L 21/76832* (2013.01); *H01L 21/02211* (2013.01); *H01L 21/76224* (2013.01); *H01L 21/76825* (2013.01); *H01L 21/76826* (2013.01); *H01L 21/76831* (2013.01); *H01L 29/4966* (2013.01); *H01L 29/517* (2013.01); *H01L 29/6656* (2013.01); *H01L 29/66545* (2013.01); *H01L 29/785* (2013.01)

(58) Field of Classification Search
CPC .................................................. H01L 21/76831
See application file for complete search history.

(56) References Cited

U.S. PATENT DOCUMENTS

| | | | | |
|---|---|---|---|---|
| 9,530,871 | B1* | 12/2016 | Tsai ................... | H01L 21/02126 |
| 10,249,730 | B1* | 4/2019 | Belyansky ...... | H01L 21/823468 |
| 2007/0181966 | A1* | 8/2007 | Watatani .......... | H01L 21/76224 |
| | | | | 257/506 |
| 2014/0191358 | A1* | 7/2014 | Liou ................ | H01L 21/76235 |
| | | | | 257/506 |
| 2014/0374838 | A1* | 12/2014 | Chen ................... | H01L 29/1054 |
| | | | | 257/401 |
| 2014/0377922 | A1* | 12/2014 | Fung ............... | H01L 21/823481 |
| | | | | 438/283 |
| 2018/0248015 | A1* | 8/2018 | Glass ..................... | B82Y 10/00 |
| 2019/0181003 | A1* | 6/2019 | Luce ................ | H01L 21/02263 |

* cited by examiner

*Primary Examiner* — Omar F Mojaddedi
(74) *Attorney, Agent, or Firm* — McClure, Qualey & Rodack, LLP

(57) ABSTRACT

A method is provided. Plural semiconductor fins are formed on a substrate, and plural trenches each of which is formed between two adjacent semiconductor fins. A silicon liner layer is deposited to be conformal to the semiconductor fins and the trenches. The silicon liner layer is deposited by using a silane compound. Then, an oxide layer is deposited on the silicon liner layer to fill the trenches and cover the semiconductor fins, in which depositing the oxide layer forms water in the oxide layer. Next, a surface of the silicon liner layer is reacted with the water, so as to remove the water from the oxide layer.

20 Claims, 25 Drawing Sheets

SEMICONDUCTOR DEVICE AND METHOD OF FORMING THE SAME

BACKGROUND

The semiconductor integrated circuit (IC) industry has experienced rapid growth. Technological advances in semiconductor materials and IC designs have produced smaller and more complex circuits. These advanced material and designs have been realized as the processing or manufacturing-related technologies have also advanced. In the course of semiconductor evolution, functional density (defined as the number of interconnected devices per unit of area) has increased as the feature size has decreased. A scaling down process generally provides benefits by increasing production efficiency and lowering associated costs. One of the developments is the replacement or supplementation of a conventional planar metal-oxide-semiconductor field-effect transistor by a vertical field-effect transistor. However, existing vertical field-effect transistors have not been satisfactory in all aspects, and similar developments of tools and methods for measuring wafers during IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
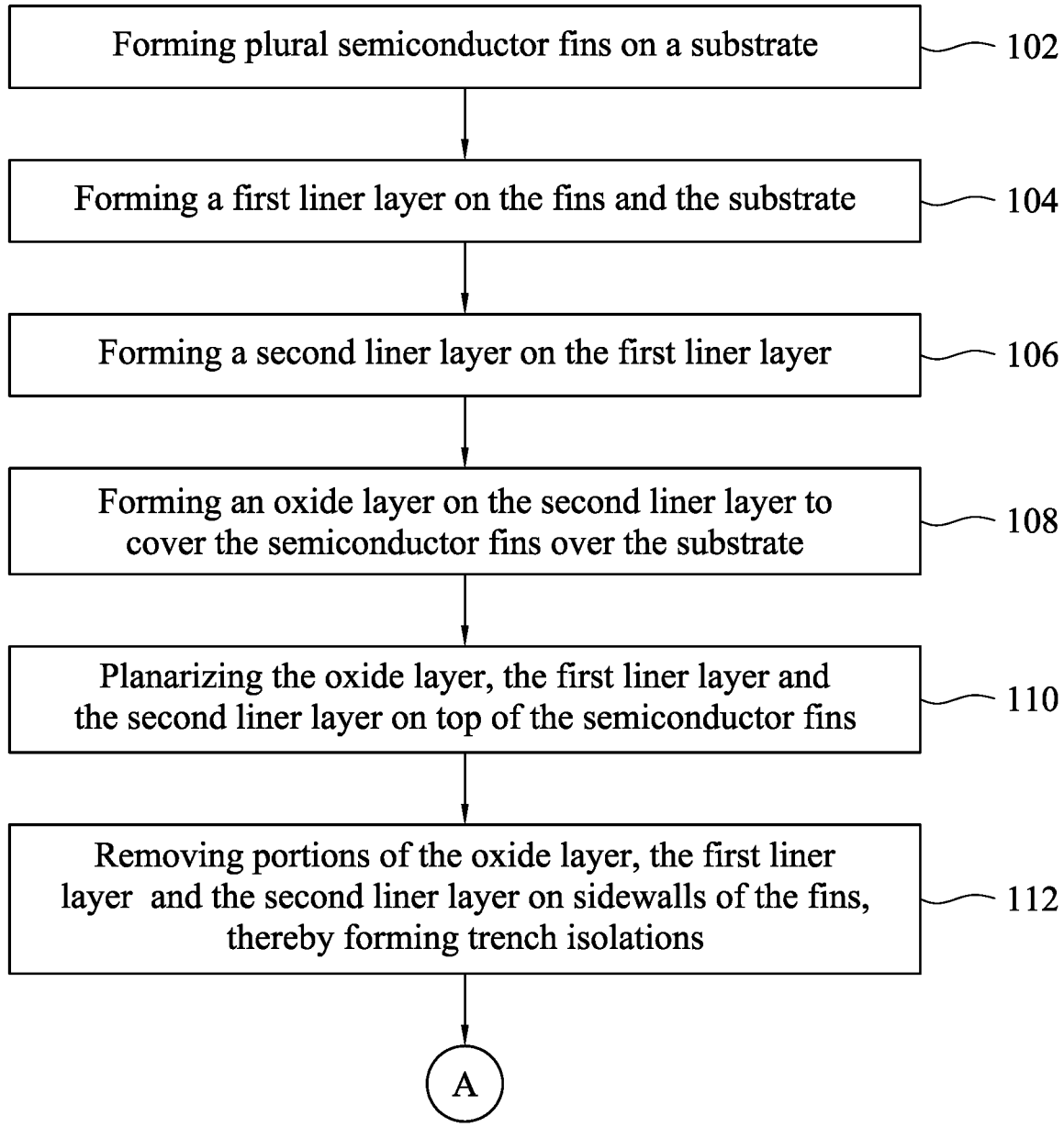
FIG. 1A through FIG. 1C are flow charts showing a method for forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

With the increase of functional density, in a semiconductor device, aspect ratios of trenches in a substrate or gaps between gate stacks become higher. In a typical method, shallow trench isolations (STIs) or interlayer dielectric (ILD) layers are formed by performing a deposition operation using a silyamine compound, a nitrogen source and an oxygen-containing species as precursors to fill the trenches or the gaps, followed by a wet annealing operation at a high temperature for converting the deposited product into silicon oxide. The typical method has a high thermal budget and has difficulties for filling the trenches or the gaps with high aspect ratios.

To tackle the problems of the typical method, a flowable chemical vapor deposition (FCVD) operation is performed to fill the trenches with silicon oxide, in some embodiments of the present disclosure. In the FCVD operation, precursors may form silicon oxide oligomers that have flowability to fill the trenches, and water may be formed because of a condensation reaction of the precursors. However, excess water is not removed easily and may remain in the STIs and the ILD layers because of the high aspect ratios of the trenches and the gaps, thus resulting in delamination and/or porosity (i.e. formation of voids) of the STIs and the ILD layers. The problem becomes worse as the aspect ratios of the trenches are getting higher. The delamination and/or porosity may lead to insufficient mechanical strength, poor insulating property and poor etching resistance of the STIs and the ILD layers.

Embodiments of the present disclosure are directed to forming respective silicon (Si) liner layers before the STIs and/or the ILD layers are deposited. Such Si liner layers are able to absorb the excess water in the STIs and/or the ILD layers that are subsequently formed, thereby improving qualities of the STIs and the ILD layers. In some embodiments, the term "absorb the water" is performed by reacting a surface of the Si liner layer with the water. Furthermore, silicon of the Si liner layer may provide additional silicon atoms for the STIs and the ILD layers, so as to improve the etching resistance of the STIs and the ILD layers against etchants such as diluted hydrogen fluoride (DHF).

Figure 1B:
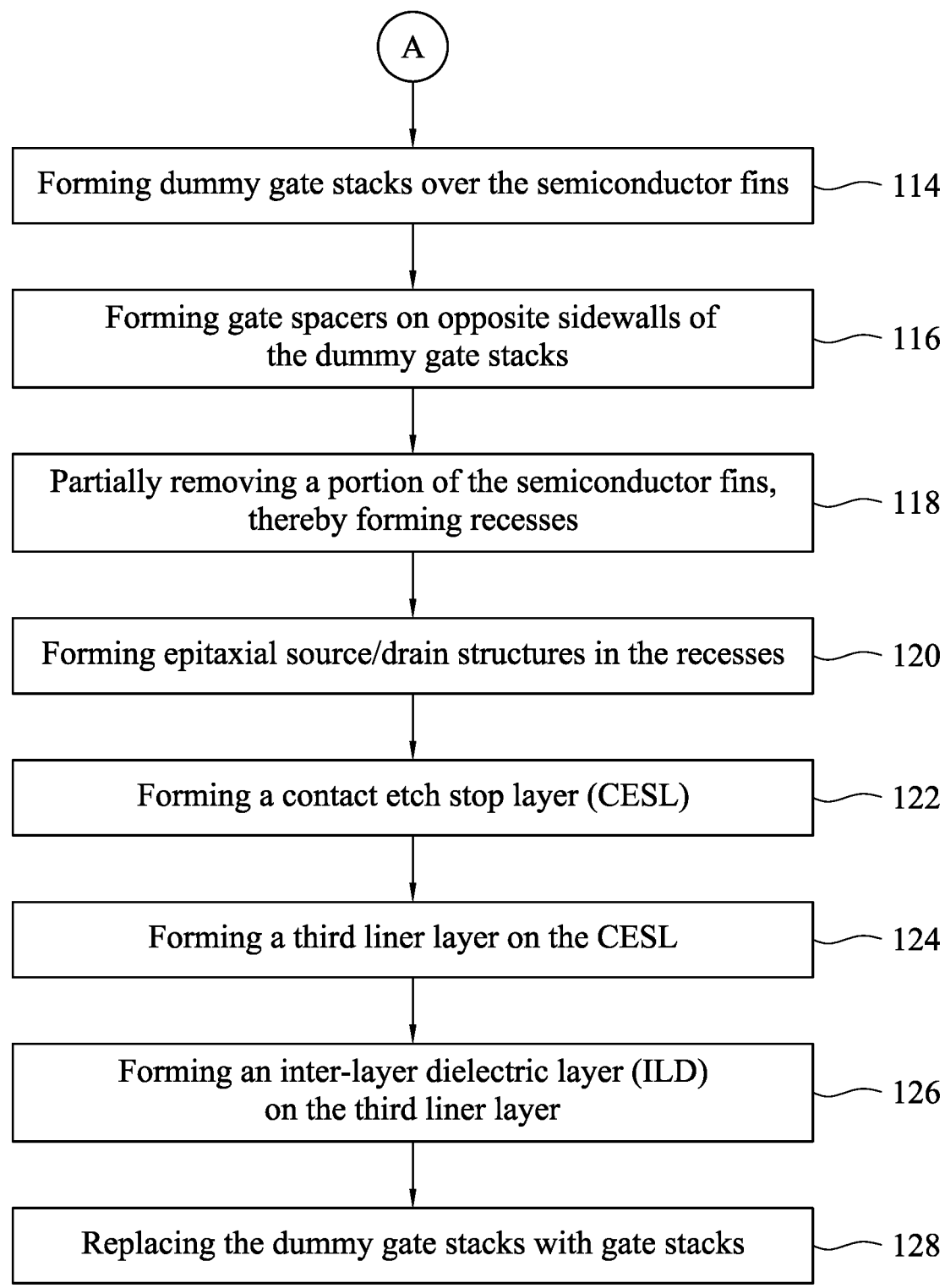
Figure 2:
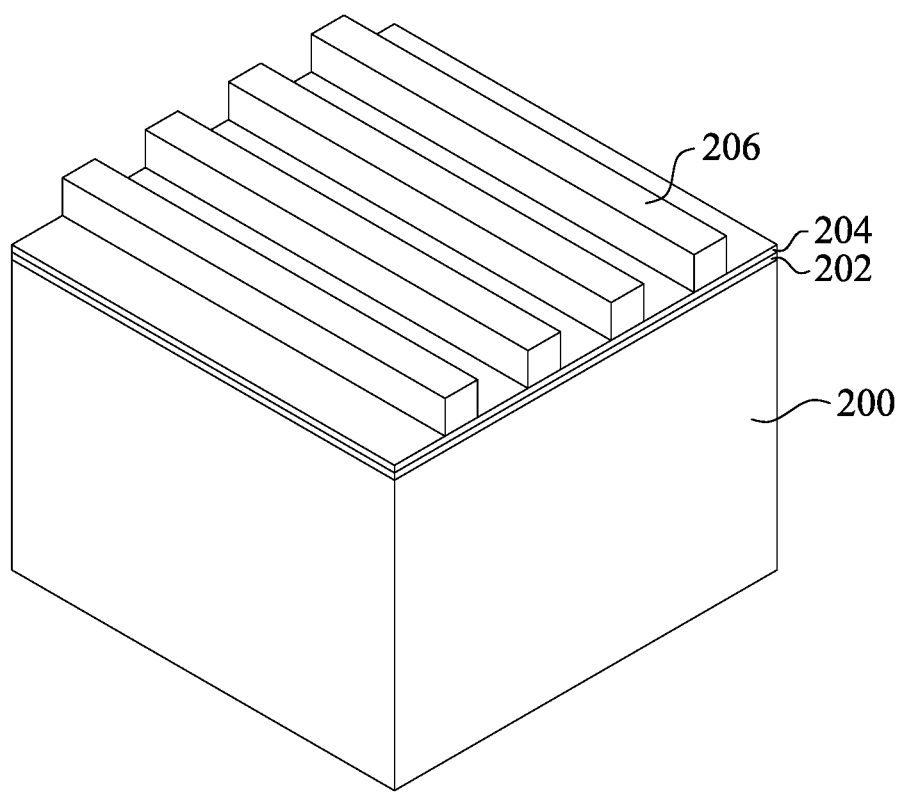
FIG. 2 through FIG. 16B are schematic views of intermediate stages showing a method for forming a semiconductor device in accordance with some embodiments of the present disclosure.

FIG. 1A and FIG. 1B are flow charts showing a method for forming a semiconductor device in accordance with some embodiments of the present disclosure. FIG. 2 through FIG. 16B are schematic views of intermediate stages showing a method for forming a semiconductor device in accordance with some embodiments of the present disclosure. Reference is made to FIG. 1A and FIG. 2. At operation 102, plural semiconductor fins 201 are formed on a substrate 200. As shown in FIG. 2, a substrate 200 is illustrated, and it may be a semiconductor substrate, such as a bulk semiconductor, a semiconductor-on-insulator (SOI) substrate, or the like. The substrate 200 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 202 and a mask layer 204 are formed on the substrate 200. The pad layer 202 may be a thin film including silicon oxide formed using, for example, a thermal oxidation process. The pad layer 202 may act as an adhesion layer between the substrate 200 and the mask layer 204. The pad layer 202 may also act as an etch stop layer for etching the mask layer 204. In some embodiments, the mask layer 204 is formed of silicon nitride, for example, using low-pressure chemical vapor deposition (LPCVD) or plasma enhanced chemical vapor deposition (PECVD). The mask layer 204 is used as a hard mask during subsequent photolithography processes. A photo-sensitive layer 206 is formed on the mask layer 204 and is then patterned, forming openings in the photo-sensitive layer 206, so that some regions of the mask layer 204 are exposed.

Figure 3:
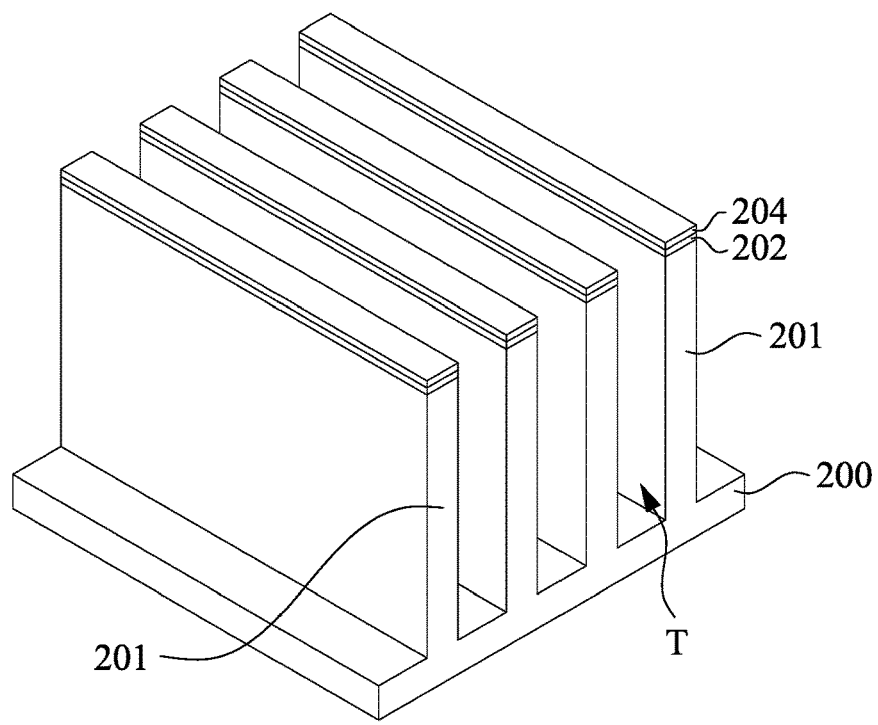

Please refer to FIG. 2 and FIG. 3. The mask layer 204 and the pad layer 202 are etched by using the photo-sensitive layer 206 as a mask, such that the underlying substrate 200 is exposed. The exposed substrate 200 is then etched, thereby forming trenches T. In some embodiments, an aspect ratio (height to width) of each of the trenches T may be about 15 to about 25. A portion of the substrate 200 between neighboring trenches T can be referred to as a semiconductor fin 201. The trenches T may be trench strips that are substantially parallel to each other. Similarly, the semiconductor fins 201 are substantially parallel to each other. After etching the substrate 200, the photo-sensitive layer 206 is removed. Next, a cleaning operation may be performed to remove a native oxide of the semiconductor substrate 200. The cleaning operation may be performed using diluted hydrofluoric (HF) acid, for example.

Figure 4:
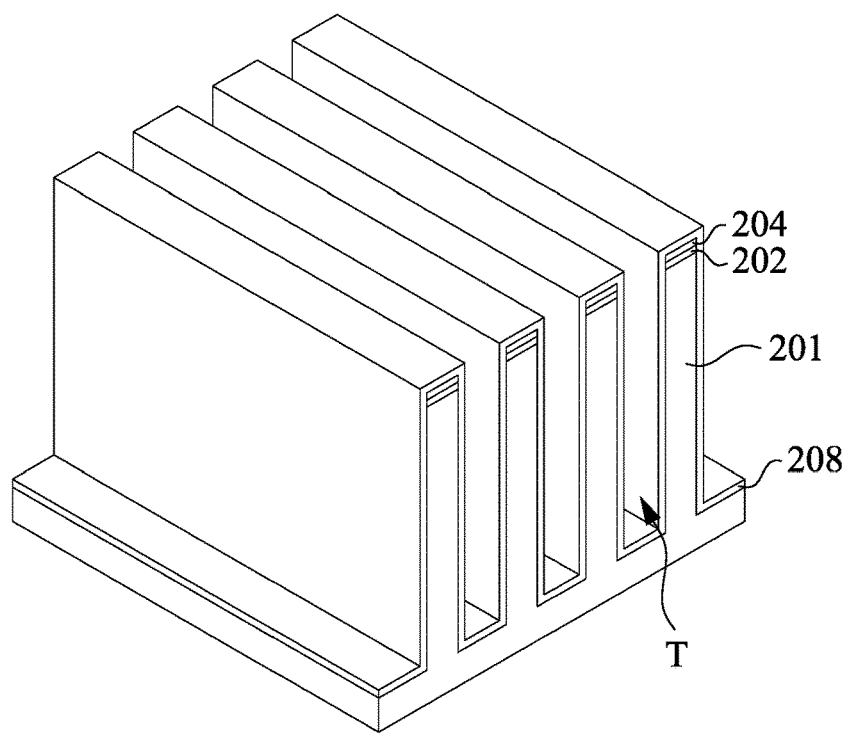

Reference is made to FIG. 1A and FIG. 4. At operation 104, a first liner layer 208 is formed conformally to the semiconductor fins 201 and the trenches T over the substrate 200. In some embodiments, the first liner layer 208 is formed from silicon oxide, silicon nitride, or a combination thereof. In one example, the first liner layer 208 is formed from silicon nitrides. In some embodiments, the first liner layer 208 may be formed by sub-atmospheric chemical vapor deposition (SACVD), atomic layer deposition (ALD) or the like. In some embodiments, a thickness of the first liner layer 208 is in a range substantially from 25 Å to 45 Å. The first liner layer 208 may be referred to as a trench isolation liner layer which provides protection to its underlying substrate and the semiconductor fins 201. When the thickness of the first liner layer 208 is greater than about 45 Å, the trenches T have less space for forming the trench isolations in subsequent processes. On the other hand, when the thickness of the first liner layer 208 is smaller than about 25 Å, the first liner layer 208 may fail to provide sufficient protection on the semiconductor fins 201.

Figure 5A:
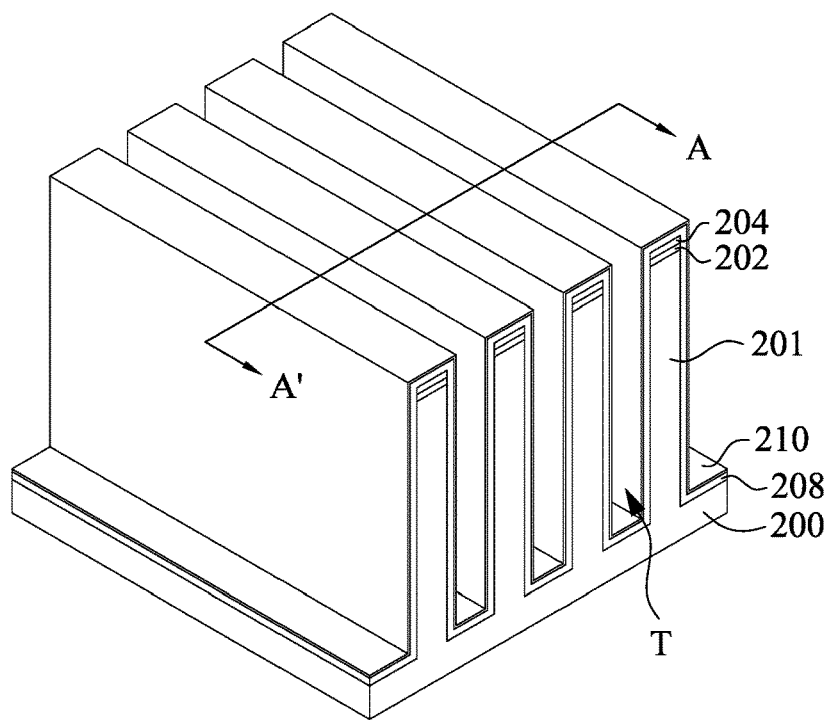
Figure 5B:
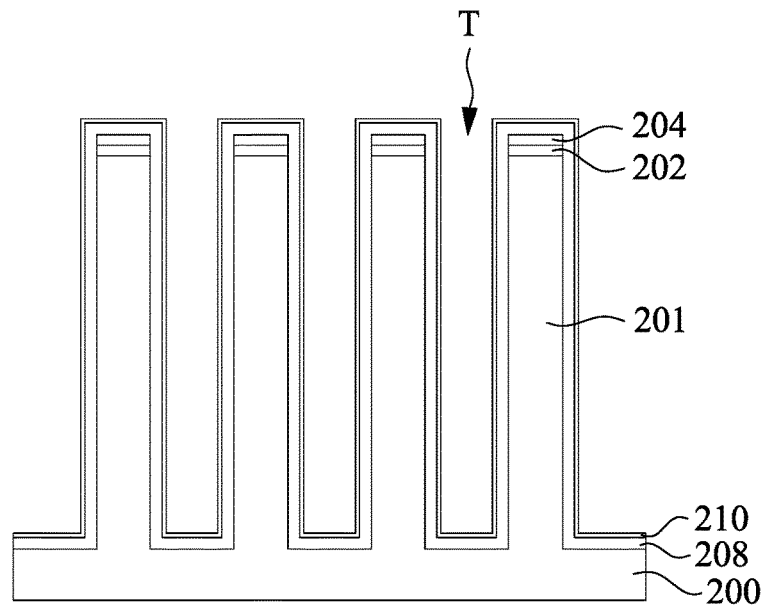

Reference is made to FIG. 1A, FIG. 5A and FIG. 5B. FIG. 5B is a cross-sectional view viewed along a cut line A-A' of FIG. 5A. At operation 106, a second liner layer 210 is formed on the first liner layer 208 and the second liner layer 210 is conformal to the semiconductor fins 201 and the trenches T. In some embodiments, the second liner layer 210 is a Si liner layer having an oxygen content equal to or less than about 1 at % and a nitrogen content equal to or less than about 1 at %. When the oxygen content or the nitrogen content of the second liner layer 210 is greater than the upper limit, the second liner layer 210 cannot effectively absorb the water in an oxide layer subsequently formed. In some embodiments, the second liner layer 210 is formed by an epitaxial process or low-pressure chemical vapor deposition (LPCVD) using a silane compound as a precursor. In some embodiments, the silane compound may include, but is not limited to, diisopropylaminosilane, monosilane, disilane or a combination thereof. In other embodiments, the second liner layer 210 is primarily formed from amorphous silicon that contains more hydrogen than crystalline silicon used for forming the substrate 200). In some embodiments, the second liner layer 210 has a thickness in a range substantially from 1 nm to 10 nm. If the thickness of the second liner layer 210 is smaller than 1 nm, the second liner layer 210 is unable to effectively absorb water formed during a subsequent oxide layer formation operation, causing a porous oxide layer having an insufficient mechanical strength and an insufficient insulating property. In addition, if the thickness of the second liner layer 210 is greater than 10 nm, it is difficult to fill the trenches T with oxide for forming trench isolations in subsequent processes, leading to a higher risk of current leakage. In the embodiments where the second liner layer 210 is formed by LPCVD, a temperature of the LPCVD is about 300° C. to about 650° C. In one example, the LPCVD may be performed for about 0.5 hrs to about 10 hrs. In another example, a pressure of the LPCVD is about 0.1 Torr to about 2 Torr. When the second liner layer 210 is formed under the above conditions, the quality and the conformality of the second liner layer 210 may be improved. In some embodiments, the second liner layer 210 may be used as a barrier layer to avoid penetration of oxygen and prevent other layers (e.g. the semiconductor fins 201 formed from SiGe) underlying the second liner layer 210 from being oxidized. In some embodiment, a ratio of a thickness of the first liner layer 208 to a thickness of the second liner layer 210 before the formation of an oxide layer (described layer) is in a range substantially from 0.25 to 4.5.

Figure 1C:
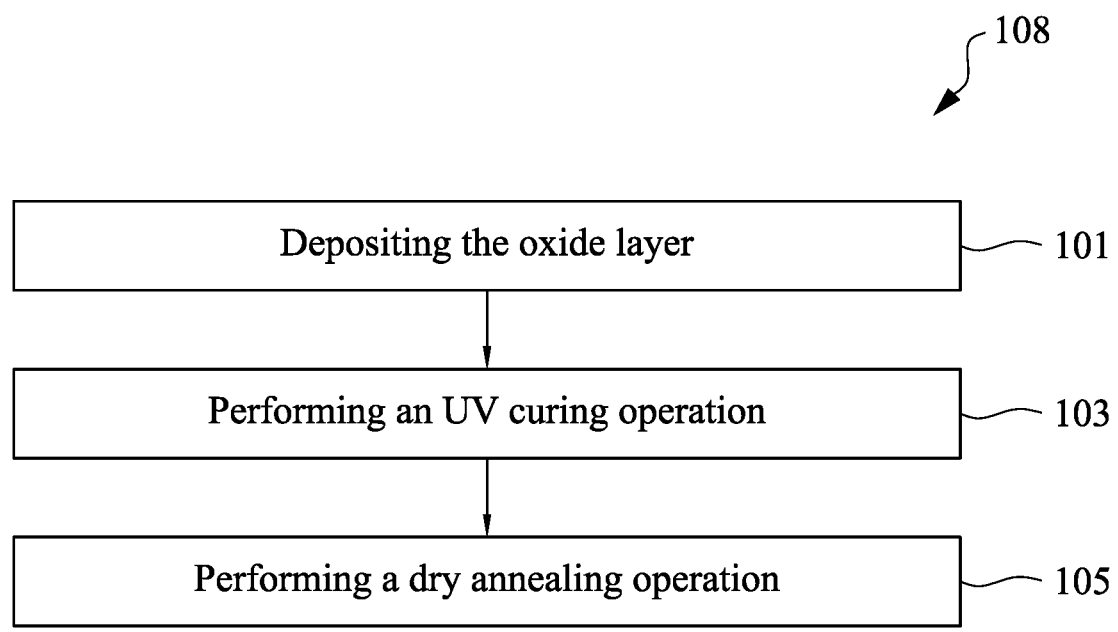
Figure 6A:
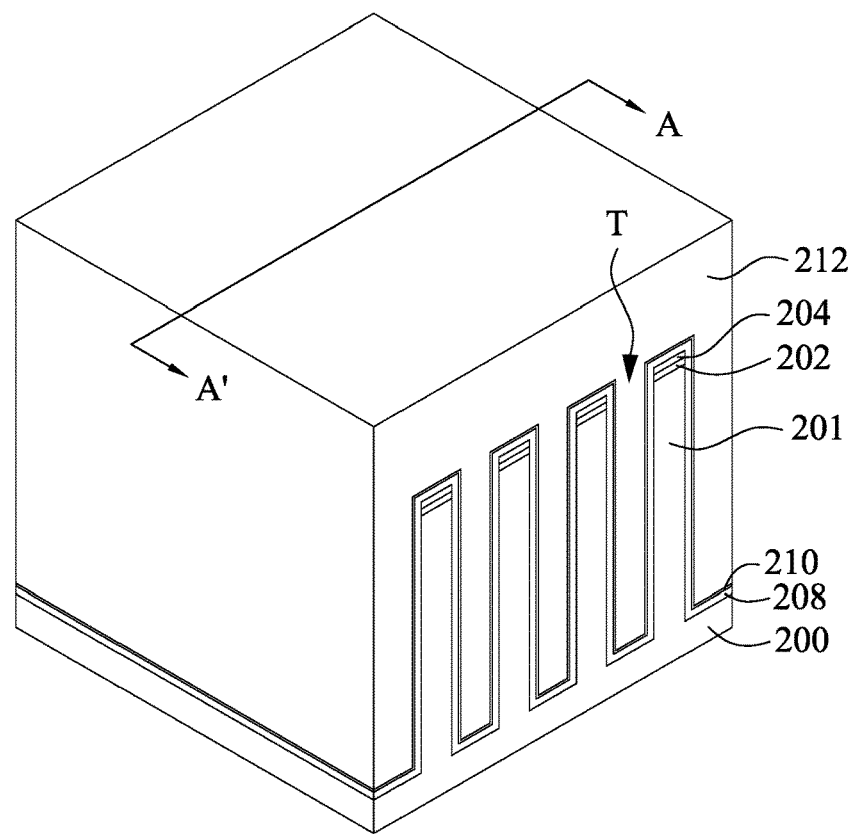
Figure 6B:
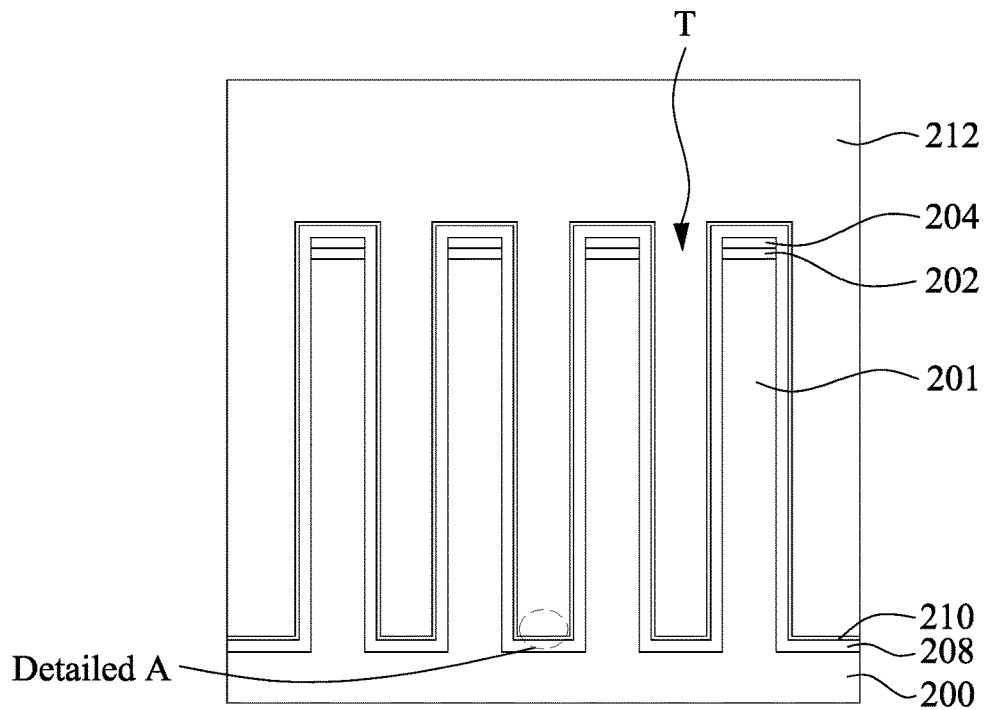
Figure 6C:
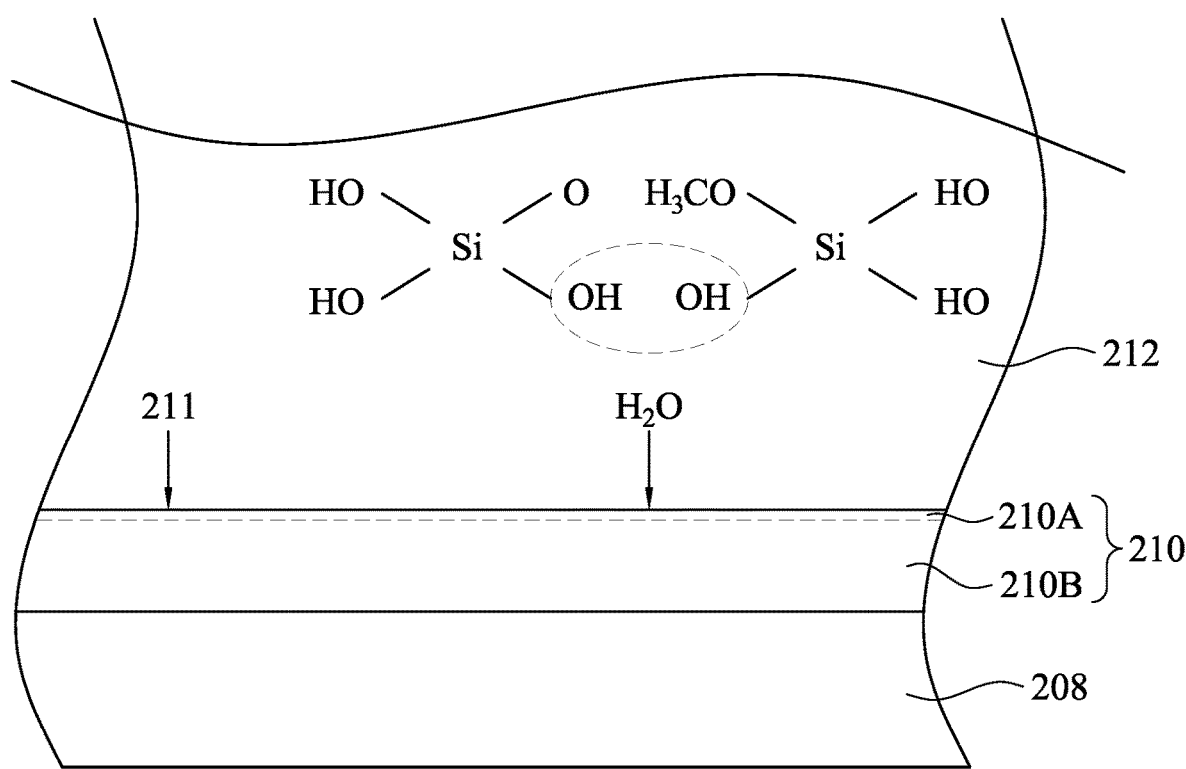

Reference is made to FIG. 1A, FIG. 6A, FIG. 6B and FIG. 6C. FIG. 6B is a cross-sectional view viewed along a cut line A-A' of FIG. 6A. FIG. 6C shows an enlarged view of detailed A shown in FIG. 6B. At operation 108, an oxide layer 212 is formed on the second liner layer 210 to cover the semiconductor fins 201 over the substrate 200. The oxide layer 212 may overfill the trenches T, and the resulting structure is shown in FIG. 6A and FIG. 6B. In some embodiments, forming the oxide layer 212 includes depositing the oxide layer 212 made of silicon oxide, as shown in operation 101 of FIG. 1C. FIG. 1C is a flow chart showing an operation of forming an oxide layer of FIG. 1A.

In some embodiments, the oxide layer 212 may be formed by flowable chemical vapor deposition (FCVD) using alkoxysilane and an oxygen-containing species as precursors. In some embodiments, the alkoxysilane may include tetramethoxysilane (TMOS), tetraethoxysilane (TEOS), dimethoxydimethylsilane (DMDMS), methyltrimethoxysilane (MTMOS), ethyltrimethoxysilane (ETMOS), vinyltrimethoxysilane (VTMOS), bis(trimethoxysilyl)ethane (BTMSE) or a combination thereof. In some embodiments, the oxygen-containing species may be oxygen, oxygen radicals, oxygen ions or a combination thereof. A radical reaction between the alkoxysilane and the oxygen-containing species is involved in the condensation reaction of the precursors to form silicon oxide oligomers. In some embodiments, the FCVD of the oxide layer 212 may be performed at a temperature in a range substantially from 65° C. to 200° C. A higher temperature of the FCVD is beneficial to removal of the water formed by the condensation reaction of the precursors (shown in FIG. 6C), and the quality of the oxide layer 212 may be improved. However, when the temperature of the FCVD is higher than about 200° C., the trenches T may be incompletely filled because the deposition rate of the oxide layer 212 is slow. When the temperature of the FCVD is lower than about 65° C., it is difficult to vaporize the alkoxysilane precursor. In some embodiments, a pressure of the FCVD may be in a range substantially from 0.5 torr to 5 torr. In some embodiments, a flow rate of the alkoxysilane in the FCVD may be in a range substantially from 300 mg/min to 900 mg/min. In some embodiments, a flow rate of the oxygen-containing species may be in a range substantially from 100 sccm to 600 sccm. The flow rates of the alkoxysilane and the oxygen-containing species controls a reaction rate of forming the oxide layer 212, so as to avoid the formation of excess water at a high reaction rate. For example, the flow rate of the alkoxysilane greater than 900 mg/min may lead to the undesired high reaction rate. Furthermore, the flow rates can be controlled to increase flowability of silicon oxide oligomers formed by the reaction, thereby improving the efficiency of filling the trenches T. Besides, a greater flow rate of the oxygen-containing species can reduce the formation of the water because the O—H bonding may be cleaved by the oxygen-containing species.

In other embodiments, the oxide layer 212 may be deposited using a high-density-plasma (HDP) chemical vapor deposition (CVD) process, using silane ($SiH_4$) and oxygen ($O_2$) as reacting precursors. In some other embodiments, the oxide layer 212 may be formed using a high aspect-ratio process (HARP), in which process gases may include tetraethylorthosilicate (TEOS) and ozone ($O_3$). In further embodiments, other process such as plasma-enhanced chemical vapor deposition (PECVD), atmospheric-pressure chemical vapor deposition (APCVD), or low-pressure chemical vapor deposition (LPCVD) may be used.

As shown in FIG. 6C, forming the oxide layer 212 further includes reacting a surface 211 of the second liner layer 210 with the water, so as to remove the water from the oxide layer 212. The surface 211 of the second liner layer 210 is reacted with the water in the oxide layer 212, and a surface portion 210A of the second liner layer 210 is converted into silicon oxide, while the other portion 210B remains as the second liner layer 210. In some embodiments, the surface portion 210A that is converted in to silicon oxide may be considered as a portion of the oxide layer 212. In some embodiments, a thickness of the surface portion 210A is equal to or smaller than about 5 nm. In some other embodiments, the thickness of the surface portion 210A is equal to or smaller than about 1 nm.

In some embodiments, reacting the surface of the silicon liner layer 210 with the water includes performing an UV curing operation on the deposited oxide layer 212 (operation 103 of FIG. 1C). In some embodiments, during the UV curing operation, the oxide layer 212 is exposed to an UV light having a wavelength about 200 nm to about 400 nm at a temperature in a range substantially from 200° C. to 500° C. for about 1 minutes to about 10 minutes, so as to remove the remaining water in the oxide layer 212. Exposure to the UV light effectively increases an efficiency of removing the water, and the time of the UV curing operation may be reduced. In yet embodiments, a dry annealing operation is performed on the oxide layer 212 after the UV curing operation, as shown in operation 105 of FIG. 1C. In some examples, the oxide layer 212 is annealed under a temperature of about 500° C. to about 800° C. for about 1 hour to about 4 hours in a nitrogen gas atmosphere. Performing the dry annealing operation may further remove the water from the oxide layer 212.

Because the water is not easily removed from the oxide layer 212 when the trenches T have a high aspect ratio (e.g. higher than 15), the second liner layer 210 plays an important role for removing the water and improving the quality of the oxide layer 212. Furthermore, reacting the surface 211 of the second liner layer 210 with the water (or absorbing the water using the second liner layer 210) may cause volume expansion of the second liner layer 210 that compresses the oxide layer 212, leading to a more compact oxide layer 212. In addition, the silicon element of the second liner layer 210 may diffuse into the oxide layer 212 and compensates for the Si-deficient silicon oxide layer 212 (i.e. a molar ratio of Si to O of the oxide layer 212 increases due to the diffusion of Si element of the second liner layer 210). The increase of the Si content in the oxide layer 212 may further improve the etching resistance of the oxide layer 212 to the typical etchants (e.g. DHF). Moreover, the second liner layer 210 provides suitable surface energy for deposition of the oxide layer 212, which also results in a better trench-filling efficiency. Therefore, the quality of the oxide layer 212 (e.g. a mechanical strength, an insulating property, and an etching resistance) may be improved in existence of the second liner layer 210.

Figure 7A:
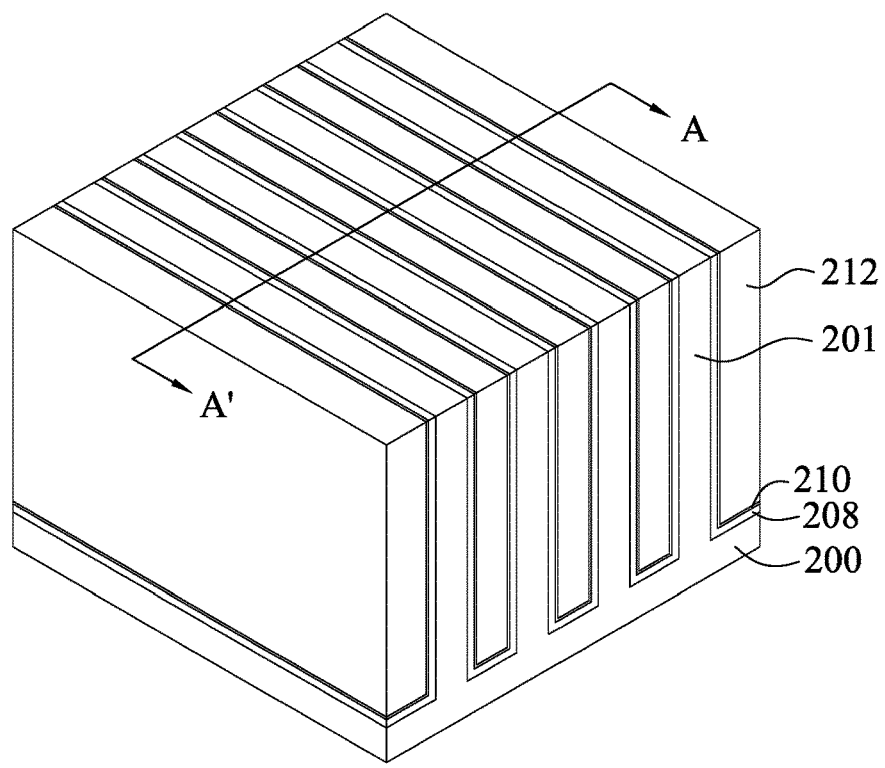
Figure 7B:
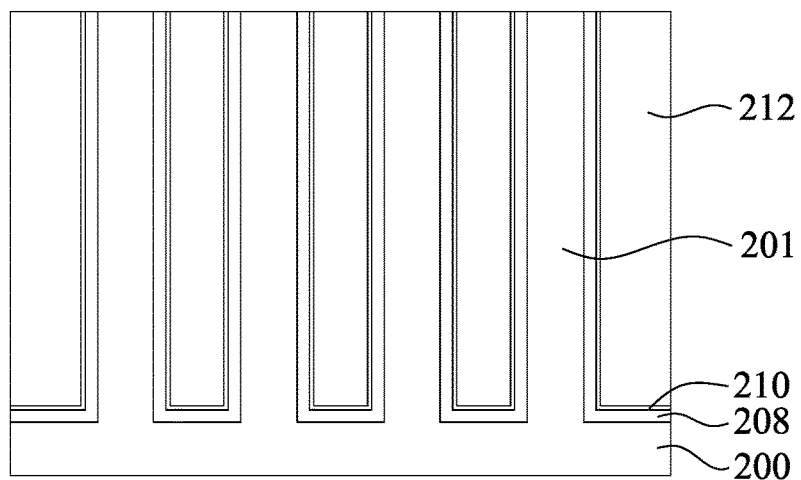

Reference is made to FIG. 1A, FIG. 6A, FIG. 6B, FIG. 7A and FIG. 7B. FIG. 7B is a cross-sectional view viewed along a cut line A-A' of FIG. 7A. At operation 110, the oxide layer 212, the first liner layer 208 and the second liner layer 210 on top of the semiconductor fins 201 are planarized by, for example, a planarization process such as chemical mechanical polish (CMP), and the resulting structure is shown in FIG. 7A and FIG. 7B. In some embodiments, the planarization process may also remove the mask layer 204 and the pad layer 202 such that the semiconductor fins 201 are exposed. In some other embodiments, the planarization process stops when the mask layer 204 is exposed. In such embodiments, the mask layer 204 may act as the CMP stop layer in the planarization. If the mask layer 204 and the pad layer 202 are not removed by the planarization process, the mask layer 204, if formed of silicon nitride, may be remove by a wet process using hot $H_3PO_4$, and the pad layer 202, if formed of silicon oxide, may be removed using diluted HF.

Figure 8A:
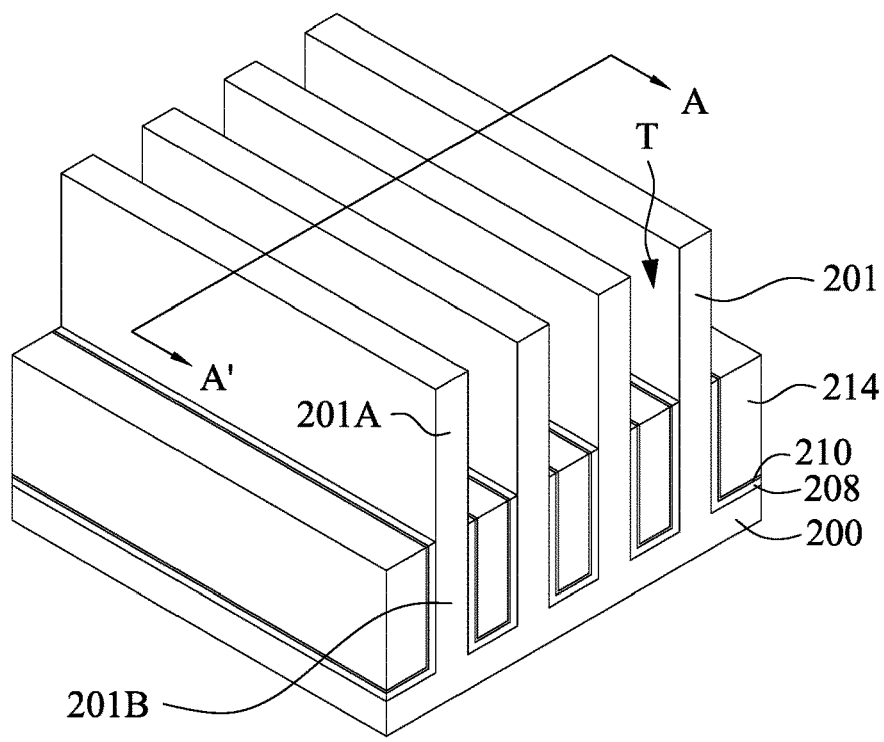
Figure 8B:
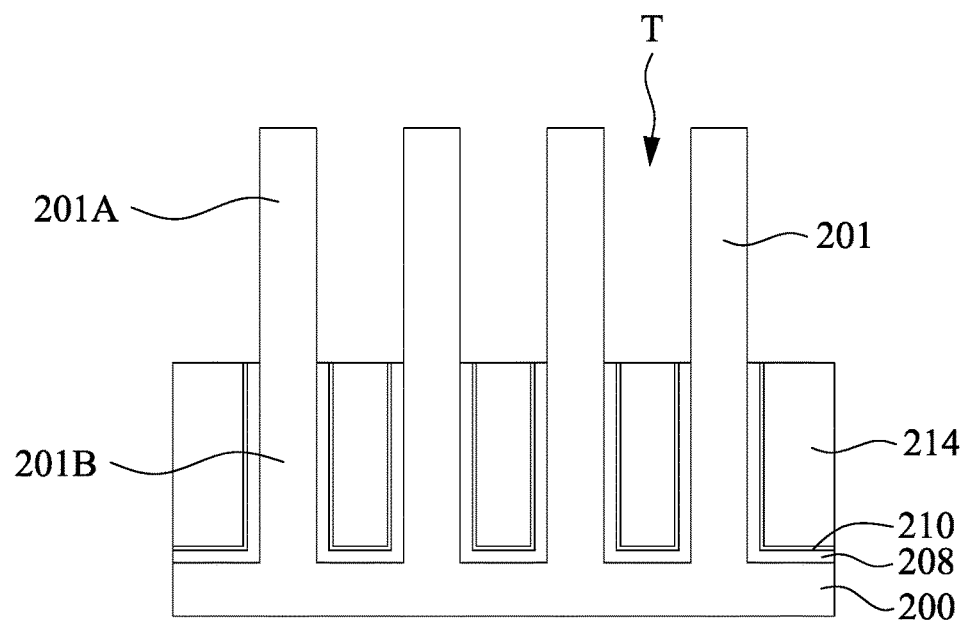

Please refer to FIG. 1A, FIG. 7A, FIG. 7B FIG. 8A and FIG. 8B. FIG. 8B is a cross-sectional view viewed along a cut line A-A' of FIG. 8A. At operation 112, portions of the oxide layer 212, the first liner layer 208 and the second liner layer 210 (which may be partially or completely oxidized after the UV curing operation and/or the dry annealing operation according to the thickness of the second liner layer 210) on sidewalls of an upper portion 201A of the semiconductor fins 201 are removed, so as to expose the upper portion 201A of the semiconductor fins 201 and form trench isolations 214 in the trenches T, as shown in FIG. 8A and FIG. 8B. A lower portion 201B adjoins the upper portion 201A, and the other portions of the oxide layer 212, the first liner layer 208 and the second liner layer 210 formed on sidewalls of the lower portion 201B of the semiconductor fins 201 also remain in the trenches T. In other words, after the etching operation, this upper portion 201A of the semiconductor fins 201 protrudes above the trench isolations 214, the first liner layer 208 and the second liner layer 210. Furthermore, the surface portion 210A (FIG. 6C) remaining in the trenches T contacts the trench isolations 214.

In some embodiments where the second liner layer 210 is completely oxidized, removing the portions of the oxide layer 212, the first liner layer 208 and the second liner layer 210 on the sidewalls of the fins 201 may be performed by, for example, an etching operation, in which SiCoNi (including HF and $NH_3$), or the like, may be used as the etchant. In some embodiments, a ratio of flow rate of the HF and flow rate of the $NH_3$ is about 20:1 to about 1:6. In some other embodiments, the chemical oxide removal process is performed at a temperature about 5° C. to about 300° C. In some embodiments where the second liner layer 210 is partially oxidized during the formation of the oxide layer 212, the oxide layer 212, the second liner layer 210 and the first liner layer 208 may be sequentially removed by different operations. For example, the oxide layer 212 may be removed by using the SiCoNi etchant, in which the removed oxide layer 212 may form volatile species that can be pumped out in vacuum. Then, the remaining second liner layer 210 that is not oxidized can be etched by a wet etch operation using an etchant including three or more of HF, $HNO_3$, $CH_3COOH$ and $H_2O$. Alternatively, the wet etch process may use DHF having a volume ratio of water to HF of about 50:1 to about 500:1 first, followed by using diluted KOH or $NH_4OH$. In some other embodiments, the second liner layer 210 can also be removed by a dry etch operation using halogen-based etchant. Alternatively, additional wet or dry anneal at a temperature about 400° C. to about 800° C. after the removal of the oxide layer 212 can convert the remaining second liner layer 210 into $SiO_2$ which can then be removed by conventional DHF process. Thereafter, the first liner layer 208 may be removed by the same way as the removal of the oxide layer 212.

It is understood that the processes described above are some examples of how semiconductor fins 201 and the trench isolations 214 are formed. In other embodiments, a dielectric layer can be formed over a top surface of the substrate 200; trenches can be formed by etching through the dielectric layer; homoepitaxial structures can be epitaxially grown in the trenches; and the dielectric layer can be recessed such that the homoepitaxial structures protrude from the dielectric layer to form semiconductor fins. In still other embodiments, heteroepitaxial structures can be used for the semiconductor fins. For example, at least one of the semiconductor fins 201 can be recessed, and a material different from the recessed semiconductor fins 201 may be epitaxially grown in its place. In even further embodiments, a dielectric layer can be formed over a top surface of the substrate 200; trenches can be formed by etching through the dielectric layer; heteroepitaxial structures can be epitaxially grown in the trenches using a material different from the substrate 200; and the dielectric layer can be recessed such that the heteroepitaxial structures protrude from the dielectric layer to form semiconductor fins. In some embodiments where homoepitaxial or heteroepitaxial structures are epitaxially grown, the grown materials may be in situ doped during growth, which may obviate prior implanting of the semiconductor fins although in situ and implantation doping may be used together. In some embodiments, at least one of the semiconductor fins 201 may include silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 9:
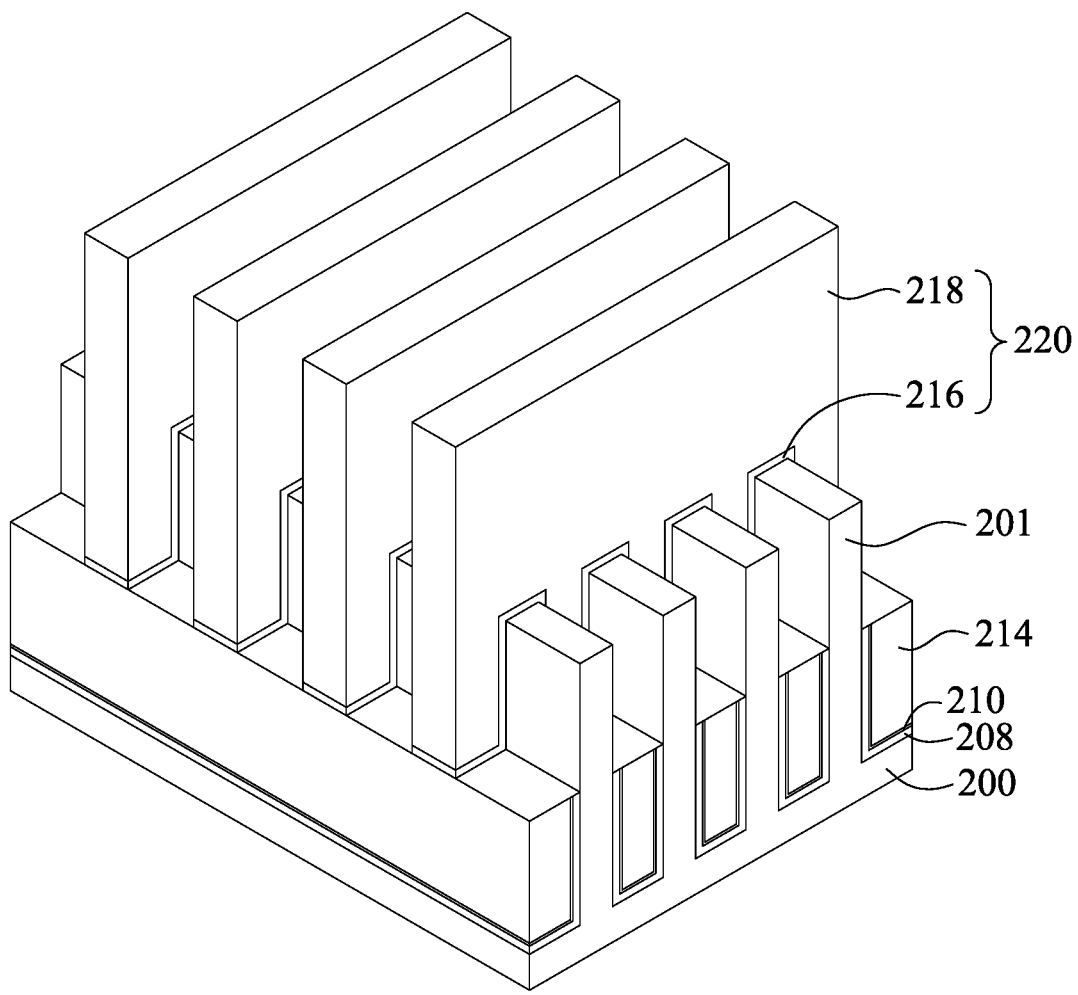

Reference is made to FIG. 1B and FIG. 9. At operation 114, dummy gate stacks are formed crossing the semiconductor fins 201. Forming the dummy gate stacks includes blanket forming a gate dielectric layer 216 over the substrate 200 to cover the semiconductor fins 201 and the trench isolations 214. In some embodiments, the gate dielectric layer 216 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 216 is an oxide layer. The gate dielectric layer 216 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 216 is formed, a dummy gate electrode layer 218 is formed over the gate dielectric layer 216. In some embodiments, the dummy gate electrode layer 218 may include polycrystalline-silicon (poly-Si), poly-crystalline silicon-germanium (poly-SiGe), metallic nitrides, metallic silicides, metallic oxides, or metals. In some embodiments, the dummy gate electrode layer 218 includes a metal-containing material such as TiN, TaN, TaC, Co, Ru, Al, combinations thereof, or multi-layers thereof. The dummy gate electrode layer 218 may be deposited by CVD, physical vapor deposition (PVD), sputter deposition, or other techniques suitable for depositing conductive materials. Then, the dummy gate electrode layer 218 and the gate dielectric layer 216 are patterned to form dummy gate stacks 220 in accordance with some embodiments, as shown in FIG. 9. For example, a patterned mask (not shown) is formed over a portion of the dummy gate electrode layer. The mask may be a hard mask for protecting the underlying dummy gate electrode layer 218 and the gate dielectric layer 216 against subsequent etching process. In some embodiments, the mask includes an oxide mask on the dummy gate electrode layer 218, and a nitride mask on the oxide mask. An etching process is performed to form dummy gate stacks 220 wrapping the semiconductor fins 201 using the patterned mask as an etching mask. And then, in some embodiments, the patterned mask is removed after the etching. In other embodiments, the patterned mask remains to protect the dummy gate stacks 220 in the subsequent process. The dummy gate stacks 220 will be replaced with a replacement gate structure using a "gate-last" or replacement-gate process.

Figure 10:
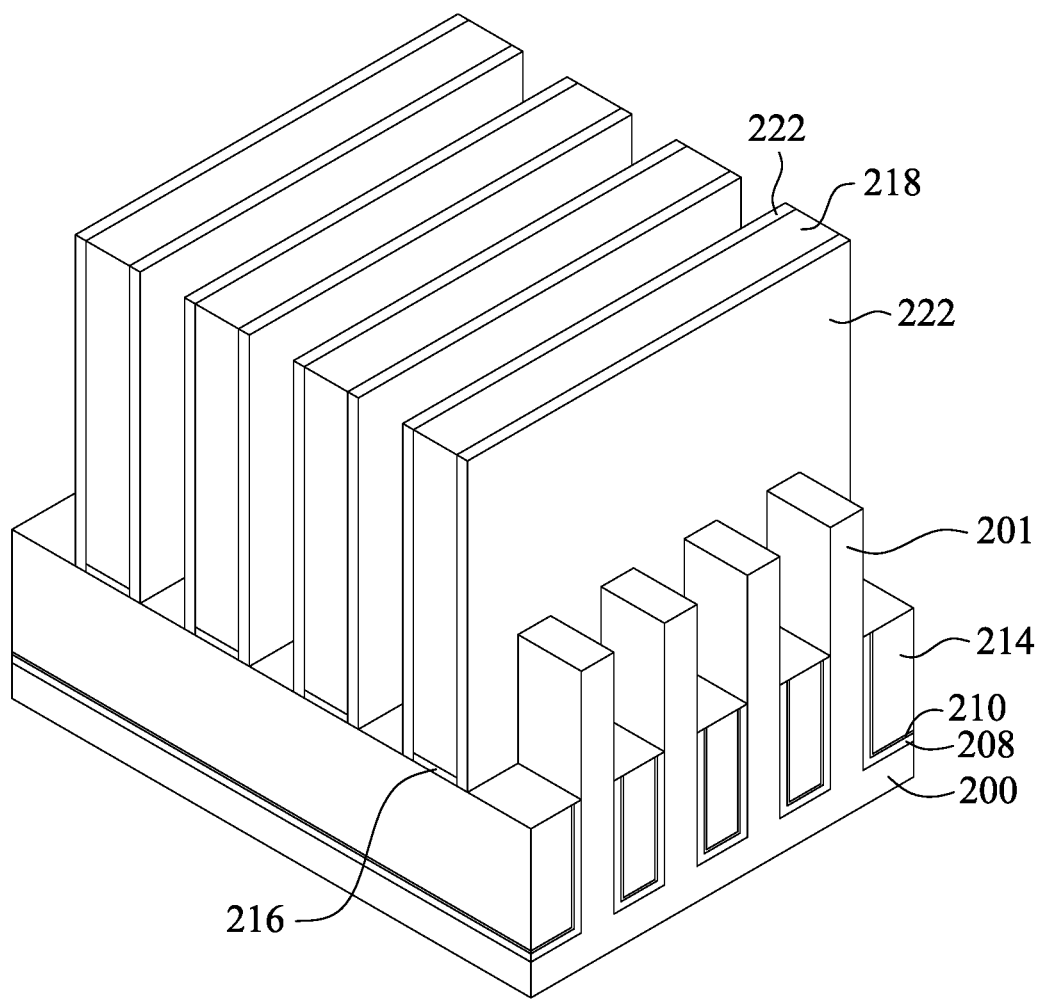

Reference is made to FIG. 1B and FIG. 10. At operation 116, gate spacers 222 are formed on opposite sidewalls of the dummy gate stacks 220. In some embodiments, the gate spacers 222 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 222 may include a single layer or multilayer structure made of different dielectric materials. The method of forming the gate spacers 222 includes blanket forming a dielectric layer on the structure shown in FIG. 9 using, for example, CVD, PVD or ALD, and then performing an etching process such as anisotropic etching to remove horizontal portions of the dielectric layer. The remaining portions of the dielectric layer on sidewalls of the dummy gate stacks 220 can serve as the gate spacers 222. In some embodiments, the gate spacers 222 may be used to offset subsequently formed doped regions, such as source/drain regions. The gate spacers 222 may further be used for designing or modifying the source/drain region profile.

Figure 11:
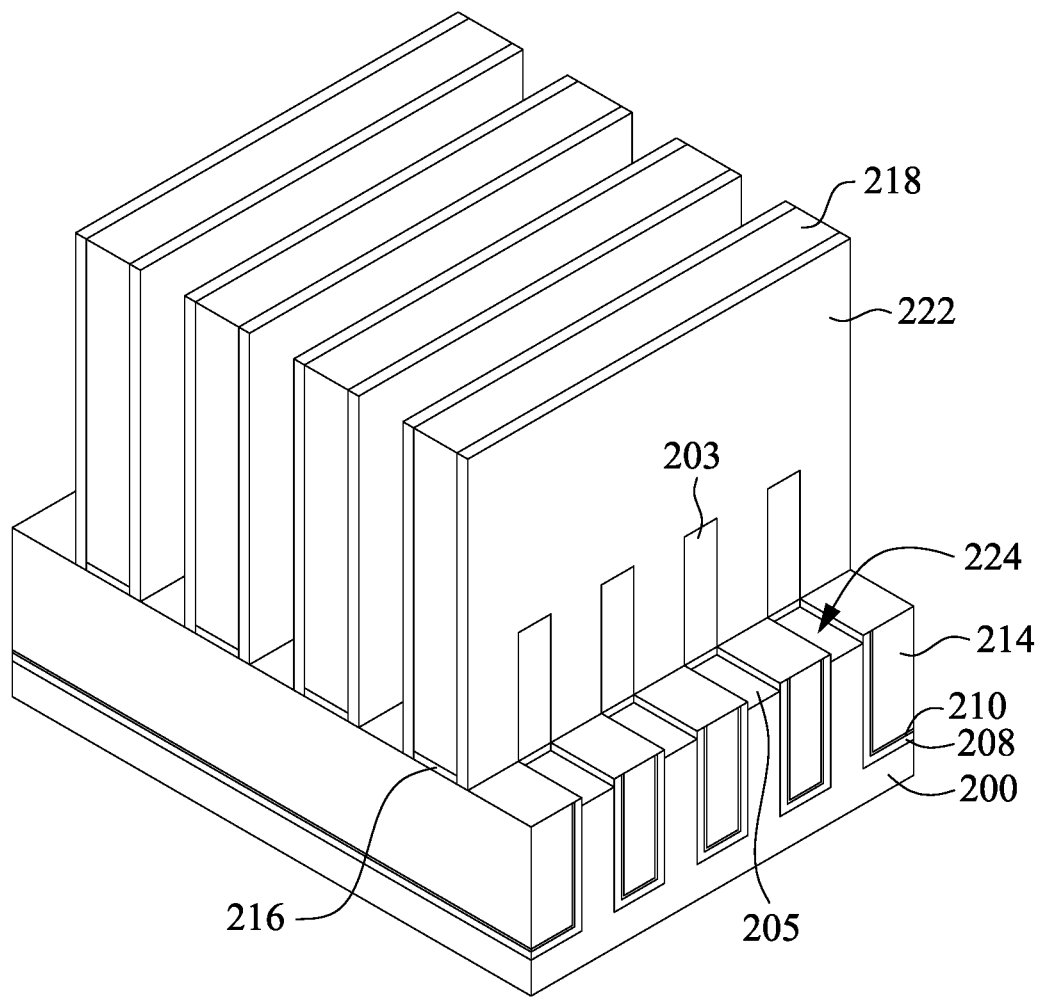

Reference is made to FIG. 1B, FIG. 10 and FIG. 11. At operation 118, portions of the semiconductor fins 201 not covered by the dummy gate stacks 220 and the gate spacers 222 are respectively partially removed (or partially recessed) to form recesses 224. The remaining semiconductor fins 201 may have a protruding portion 203 and embedded portions 205 after this removal. The embedded portions 205 are embedded in the trench isolations 214, and the embedded portions 205 are exposed by the recesses 224. The protruding portion 203 protrudes from the embedded portions 205 and is located between the recesses 224. The dummy gate stacks 220 wrap the protruding portions 203, and hence the protruding portions 203 can act as channel regions of transistors. The embedded portions 205 spaced apart from the dummy gate stacks 220 can act as source/drain regions of transistors.

Formation of the recesses 224 may include a dry etching process, a wet etching process, or combination dry and wet etching processes. This etching process may include reactive ion etch (RIE) using the dummy gate stacks 220 and gate spacers 222 as masks, or by any other suitable removal process. In some embodiments, the etching process may be performed, for example, under a pressure of about 1 mTorr to about 1000 mTorr, a power of about 10 W to about 1000 W, a bias voltage of about 20 V to about 500 V, at a temperature of about 40° C. to about 60° C., using a HBr and/or $Cl_2$ as etch gases. After the etching process, a pre-cleaning process may be performed to clean the recesses 224 with hydrofluoric acid (HF) or other suitable solution in some embodiments.

Figure 12:
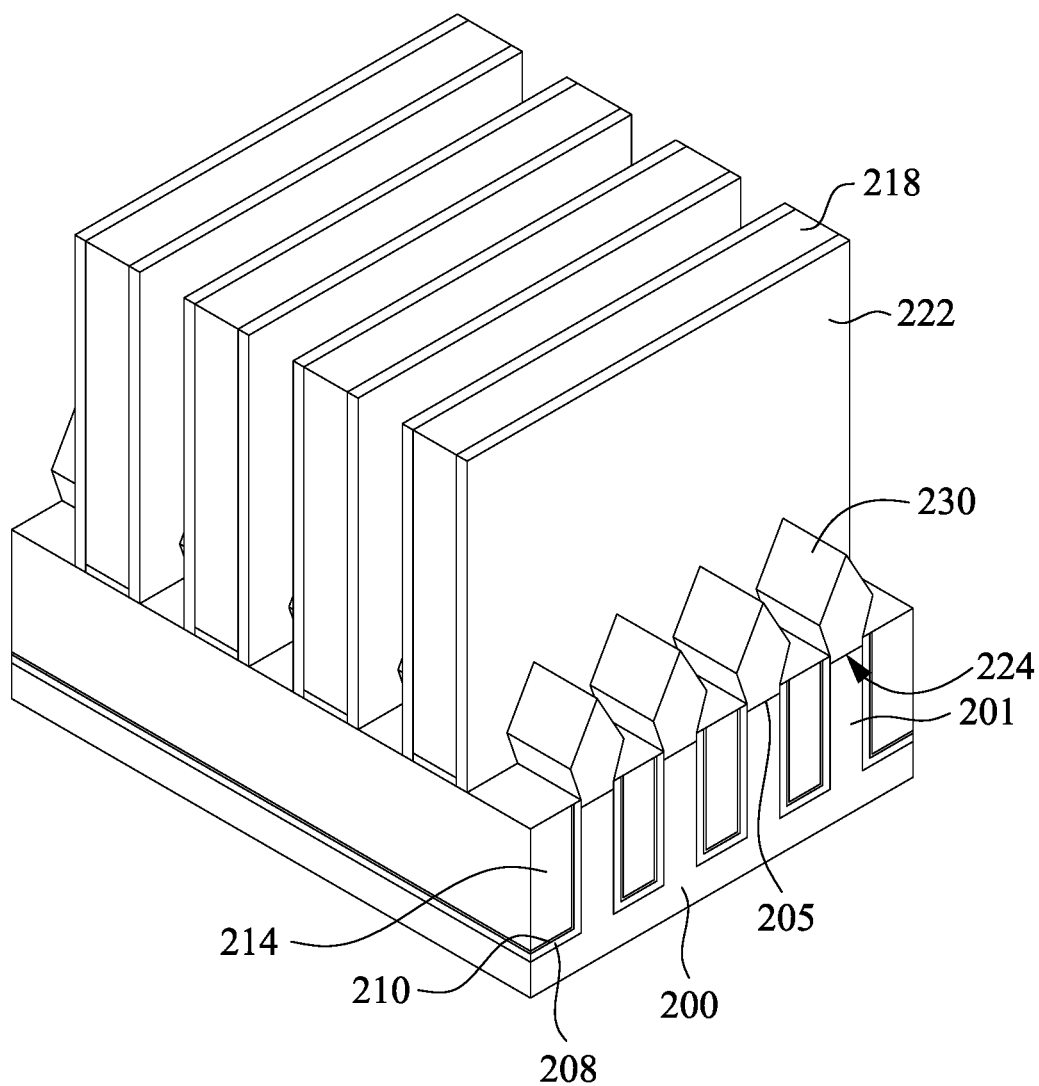

Reference is made to FIG. 1B and FIG. 12. At operation 120, epitaxial source/drain structures 230 are respectively formed in the recesses 224. The epitaxial source/drain structures 230 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portions 205 of the semiconductor fins 201. In some embodiments, lattice constants of the epitaxial source/drain structures 230 are different from that of the semiconductor fins 201, so that the channel region between the epitaxial source/drain structures 230 can be strained or stressed by the epitaxial source/drain structures 230 to improve carrier mobility of the semiconductor device and enhance the device performance.

Specifically, the electron mobility increases and the hole mobility decreases when the tensile strain is applied in the channel region, and the electron mobility decreases and the hole mobility increases when the compress strain is applied in the channel region. Therefore, an n-type transistor with a stressor configured to provide tensile strain in the channel region would be beneficial, and a p-type transistor with a stressor configured to provide compress strain in the channel region would be beneficial as well. For example, in some embodiments where two epitaxial source/drain structures 230 are used to form an n-type transistor, the epitaxial source/drain structures 230 can act as stressors including, for example, SiP, SiC or SiCP, which is able to induce tensile strain to an n-type channel; in some embodiments where two source/drain structures 230 are used to form a p-type transistor, the epitaxial source/drain structures 230 may include stressors including SiGe, which is able to induce compress strain to a p-type channel.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 201 (e.g., silicon, silicon germanium, silicon phosphate, or the like). The epitaxial source/drain structures 230 may be in-situ doped. The doping species include p-type dopants, such as boron or $BF_2$; n-type dopants, such as phosphorus or arsenic; and/or other suitable dopants including combinations thereof. If the epitaxial source/drain structures 230 are not in-situ doped, a second implantation process (i.e., a junction implant process) is performed to dope the epitaxial source/drain structures 230. One or more annealing processes may be performed to activate the epitaxial source/drain structures 230. The annealing processes include rapid thermal annealing (RTA) and/or laser annealing processes.

Figure 13A:
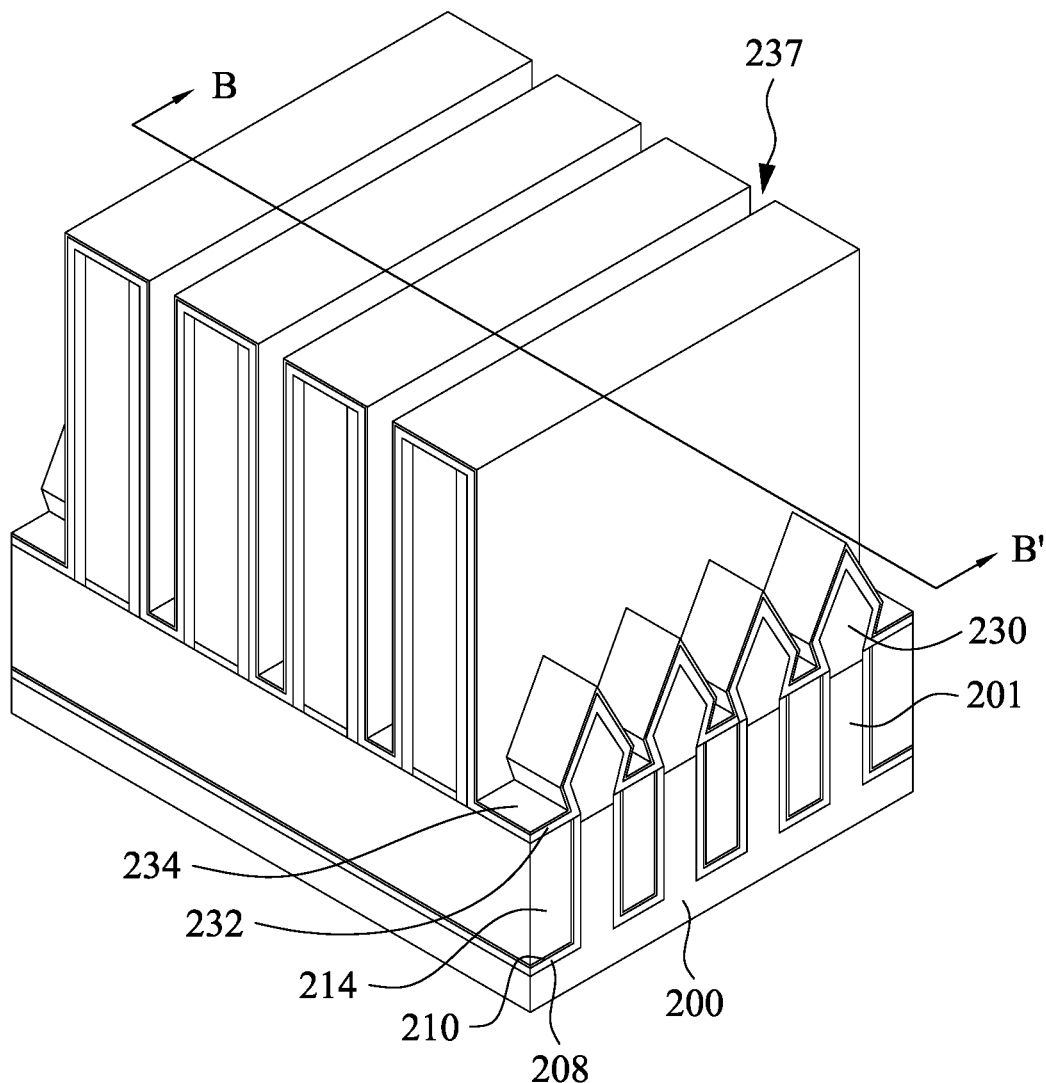
Figure 13B:
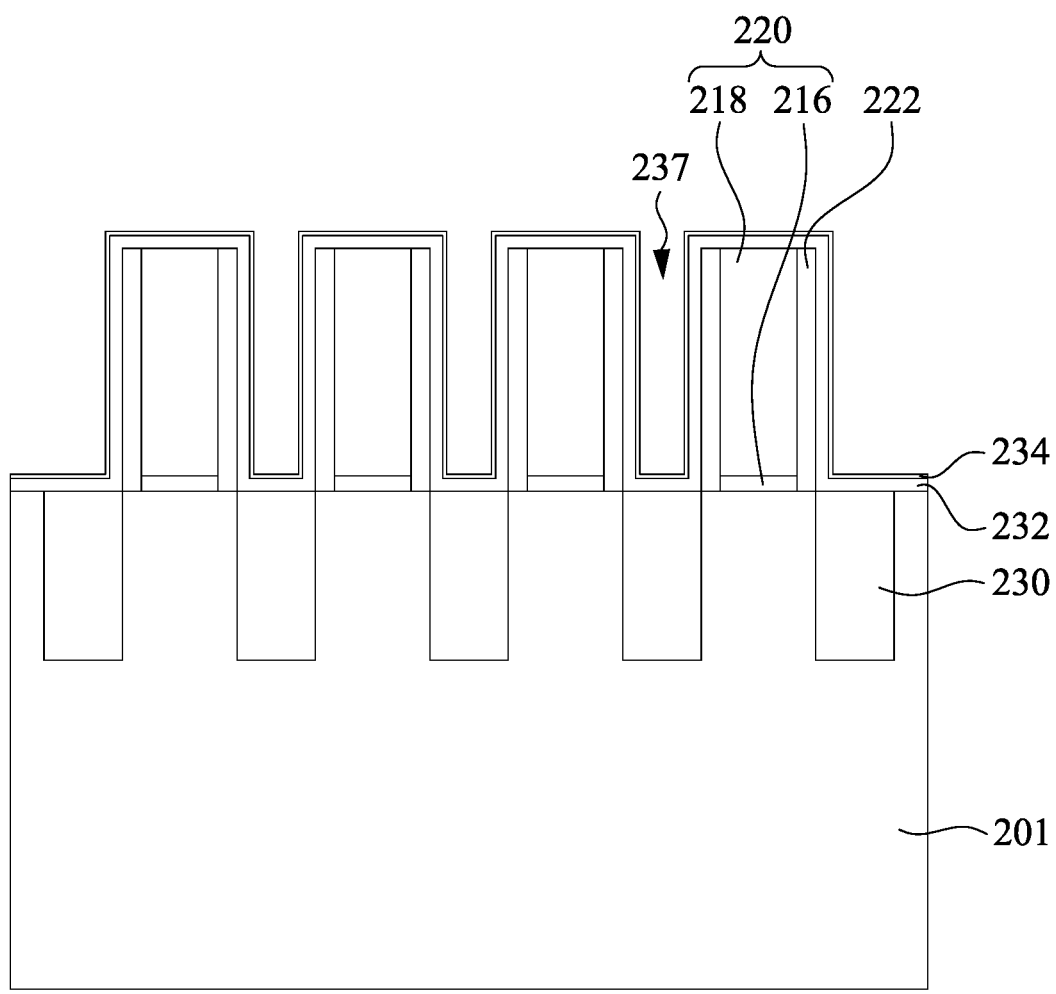

Reference is made to FIG. 1B, FIG. 13A and FIG. 13B. FIG. 13B is a cross-sectional view viewed along a cut line B-B' of FIG. 13A. At operation 122, a contact etch stop layer (CESL) 232 is blanket formed on the structure shown in FIG. 12. The CESL 232 includes silicon nitride, silicon oxynitride or other suitable materials. The CESL 232 can be formed using, for example, plasma enhanced CVD, low pressure CVD, ALD or other suitable techniques.

Still refer to FIG. 13A and FIG. 13B. At operation 124, a third liner layer 234 is blanket formed on the CESL 232, and the third liner layer 234 is conformal to the gate spacers 222, the dummy gate stacks 220 and the substrate 200. In some embodiments, the third liner layer 234 is a Si liner layer having an oxygen content equal to or less than about 1 at. % and a nitrogen content equal to or less than about 1 at %. When the oxygen content or the nitrogen content of the third liner layer 234 is greater than the upper limit, the third liner layer 234 cannot absorb the water in an ILD layer formed subsequently. In some embodiments, the third liner layer 234 is formed by an epitaxial process or LPCVD using a silane compound as a precursor. In some embodiments, the silane compound may include but is not limited to diisopropylaminosilane, monosilane, disilane or a combination thereof. In some other embodiments, the third liner layer 234 is primarily formed from amorphous silicon that contains more hydrogen than crystalline silicon (used for forming the substrate 200). In some embodiments, depositing the third liner layer 234 having a thickness in a range substantially from 1 nm to 10 nm. If the thickness of the third liner layer 234 is smaller than 1 nm, the third liner layer 234 is unable to effectively absorb water formed during a subsequent ILD layer formation operation, causing a porous ILD layer having an insufficient mechanical strength and insufficient insulating property. In addition, if the thickness of the third liner layer 234 is greater than 10 nm, it is difficult to fill the gaps 237 with oxide for forming the ILD layer in subsequent processes, leading to a higher risk of current leakage. In the embodiments where the third liner layer 234 is formed by LPCVD, a temperature of LPCVD is about 300° C. to about 650° C. In one example, the LPCVD may be performed for about 0.5 hr to about 10 hr. In another example, a pressure of the LPCVD is about 0.1 Torr to about 2 Torr. When the third liner layer 234 is formed under the above conditions, the quality and the conformality of the third liner layer 234 may be improved. In some embodiments, the third liner layer 234 may be used as a barrier layer to avoid penetration of oxygen and prevent other layers (e.g. the epitaxial source/drain structures 230 formed from SiGe) underlying the third liner layer 234 from being oxidized.

Figure 14A:
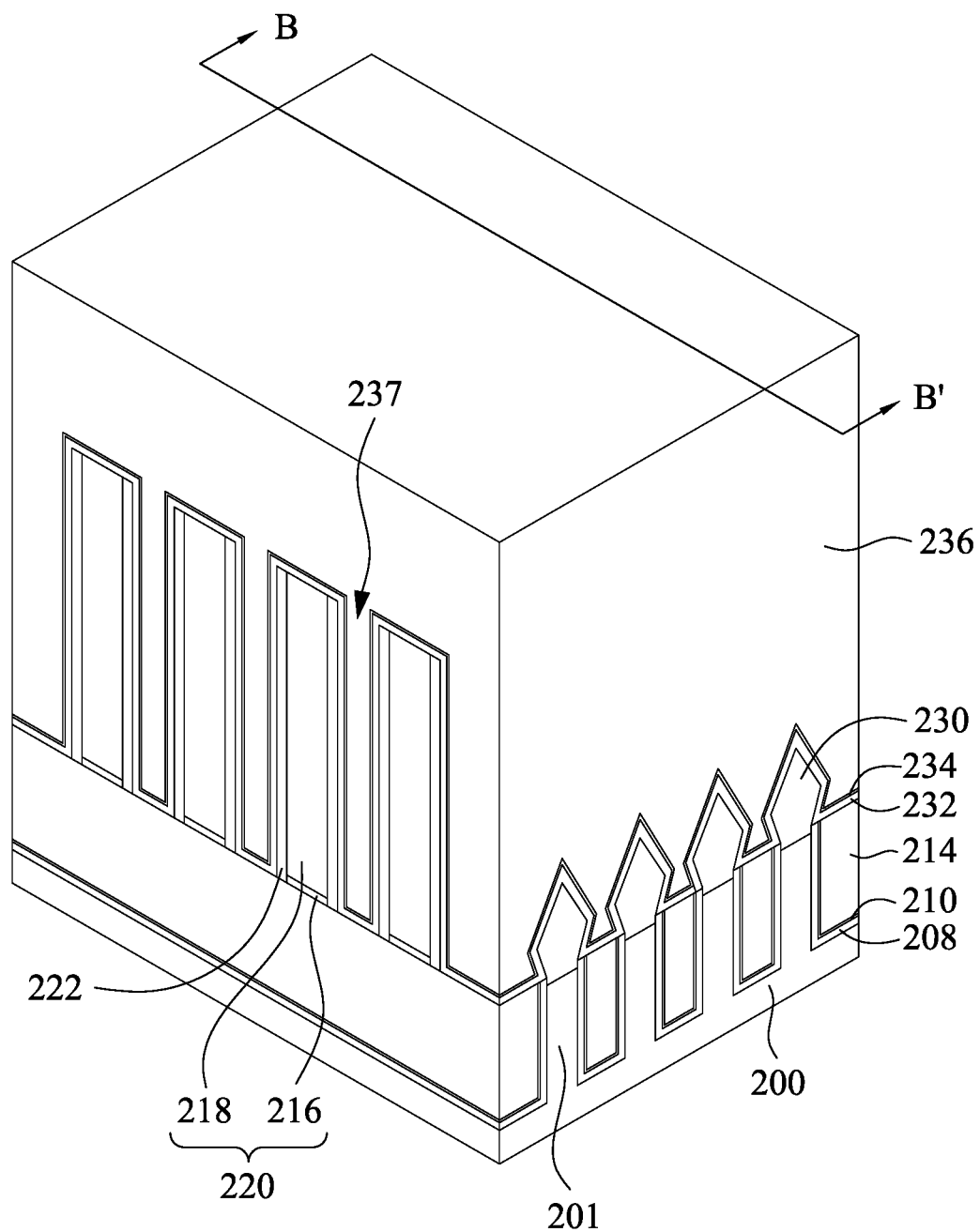
Figure 14B:
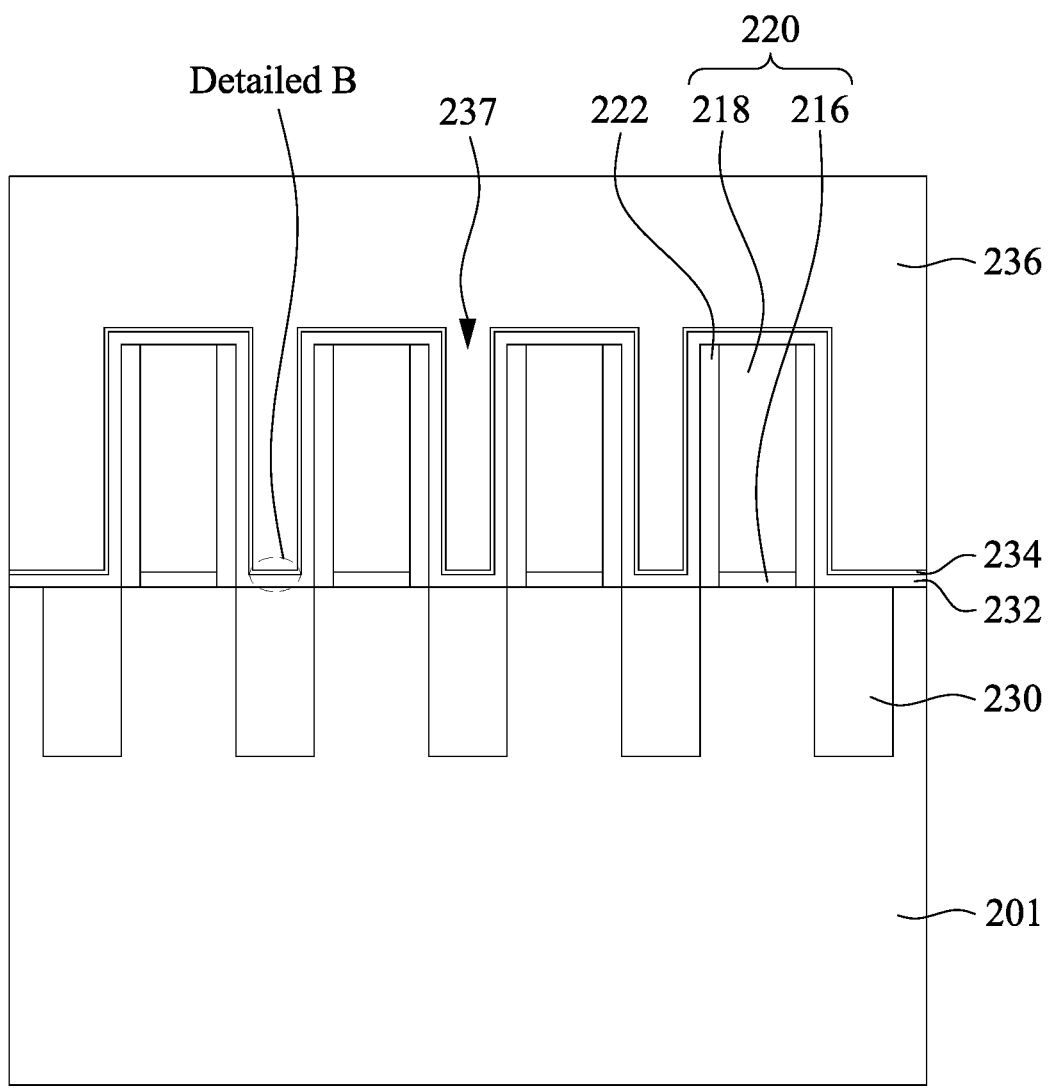
Figure 14C:
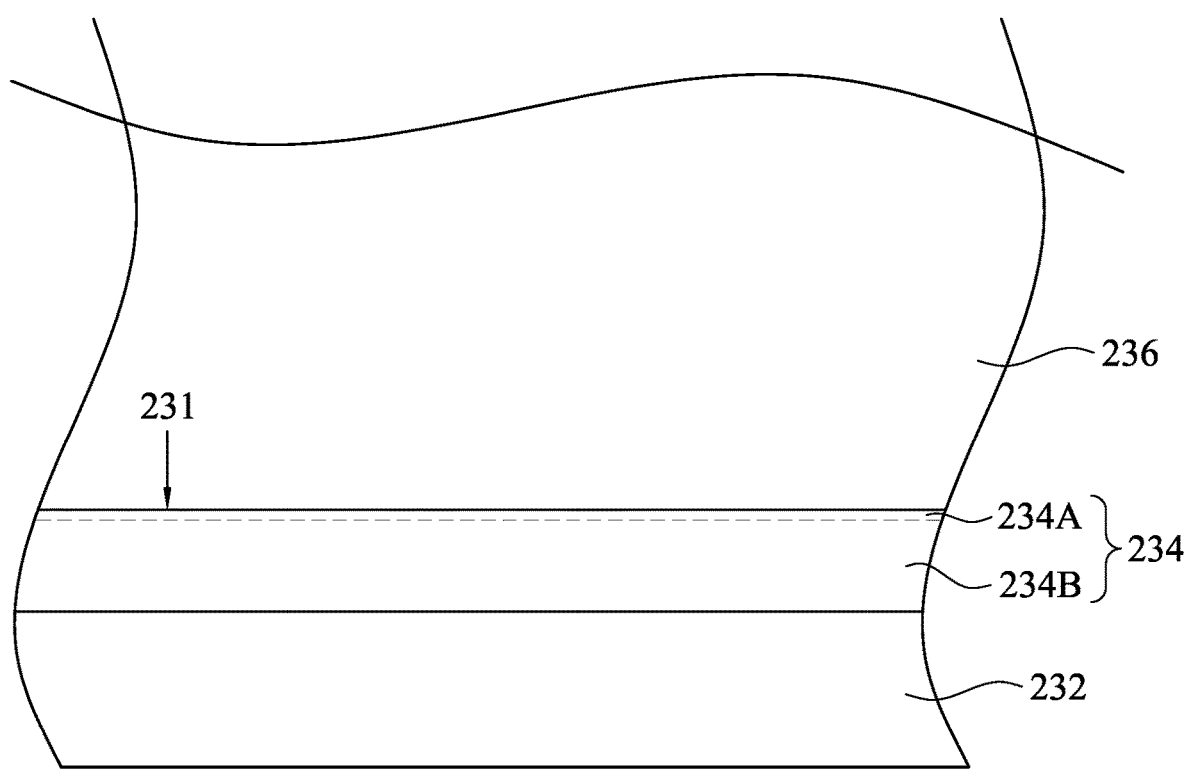
Figure 15A:
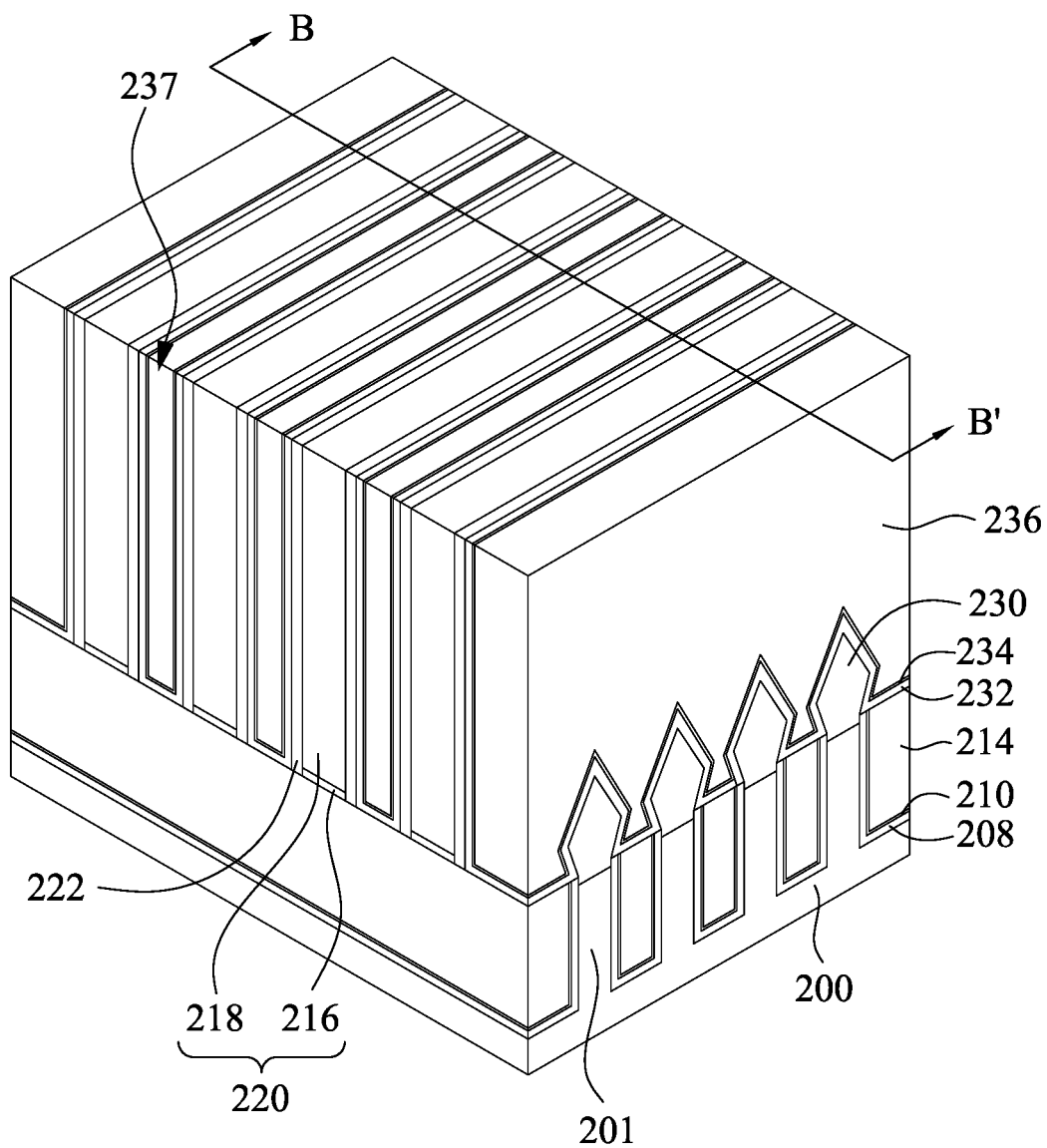
Figure 15B:
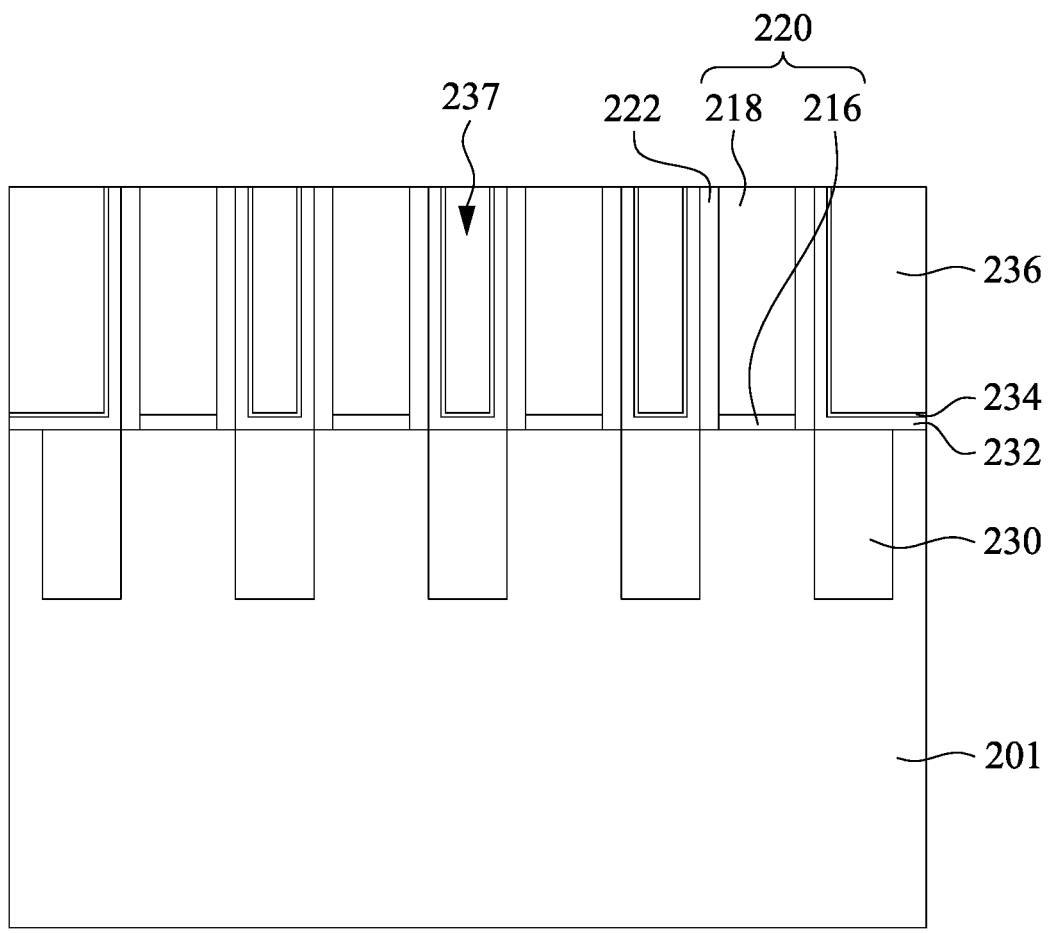

Please refer to FIG. 1B, FIG. 14A-FIG. 14C and FIG. 15A-FIG. 15B. FIG. 14B is a cross-sectional view viewed along a cut line B-B' of FIG. 14A. FIG. 14C shows an enlarged view of detailed B shown in FIG. 14B. FIG. 15B is a cross-sectional view viewed along a cut line B-B' of FIG. 15A. At operation 126, an inter-layer dielectric (ILD) layer 236 is formed on the third liner layer 234 and fills the gap 237 between two dummy gate stacks 220. As shown in FIG. 14A through FIG. 15B, forming the ILD layer 236 includes depositing a material of the ILD layer 236 on the third liner layer 234 to cover the dummy gate stacks 220 and the epitaxial structures 230, followed by removing portions of the ILD layer 236, the third liner layer 234 and the CESL 232 on top of the dummy gate stacks 220 such that the dummy gate stacks 220 and the gate spacers 222 are exposed.

In some embodiments, the ILD layer 236 may be formed by FCVD using alkoxysilane and an oxygen-containing species as precursors. In some embodiments, the alkoxysilane may include TMOS, TEOS, DMDMS, MTMOS, ETMOS, VTMOS, BTMSE or a combination thereof. In some embodiments, the oxygen-containing species may be oxygen, oxygen radicals, oxygen ions or a combination thereof. A radical reaction between the alkoxysilane and the oxygen-containing species is involved in the condensation reaction of the precursors to form silicon oxide oligomers. In some embodiments, FCVD of the ILD layer 236 may be performed at a temperature in a range substantially from 65° C. to 200° C. A higher temperature of the FCVD is beneficial to removal of the water formed by a reaction between the precursors (similar to FIG. 6C), and the quality of the ILD layer 236 may be improved. However, when the temperature of the FCVD is higher than about 200° C., the gap may be incompletely filled because the deposition rate of the ILD layer 236 is slow. When the temperature of the FCVD is lower than about 65° C., it is difficult to vaporize the alkoxysilane precursor. In some embodiments, a pressure of the FCVD may be in a range substantially from 0.5 torr to 5 torr. In some embodiments, a flow rate of the alkoxysilane in the FCVD may be in a range substantially from 300 mg/min to 900 mg/min. In some embodiments, a flow rate of the oxygen-containing species may be in a range substantially from 100 sccm to 600 sccm. The flow rates of the alkoxysilane and the oxygen-containing species controls a reaction rate of forming the ILD layer 236, so as to avoid the formation of excess water at a high reaction rate. For example, the flow rate of the alkoxysilane greater than 900 mg/min may lead to the undesired high reaction rate. Furthermore, the flow rates can be controlled to increase flowability of silicon oxide oligomers formed by the reaction, thereby improving the efficiency of filling the gap. Besides, a greater flow rate of the oxygen-containing species can reduce an amount of the water because the O—H bonding may be cleaved by the oxygen-containing species.

As shown in FIG. 14C, forming the ILD layer 236 further includes reacting a surface 231 of the third liner layer 234 with the water, so as to remove the water from the ILD layer 236. The surface 231 of the third liner layer 234 is reacted with the water in the ILD layer 236, and a surface portion 234A of the third liner layer 234 is converted into silicon oxide, while the other portion 234B remains as the third liner layer 234. That is, the surface portion 234A of the third liner layer 234 contacts the ILD layer 236. In some embodiments, the surface portion 234A that is converted into silicon oxide may be considered as a portion of the ILD layer 236. In some embodiments, a thickness of the surface portion 234A is equal to or smaller than about 5 nm. In some other embodiments, the thickness of the surface portion 234A is equal to or smaller than about 1 nm.

In some embodiments, reacting the surface 231 of the third liner layer 234 with the water includes performing an UV curing operation on the deposited ILD layer 236. In some embodiments, during the UV curing operation, the ILD layer 236 is exposed to an UV light having a wavelength about 200 nm to about 400 nm at a temperature in a range substantially from 200° C. to 500° C. for about 1 minutes to about 10 minutes, so as to remove the water remaining in the ILD layer 236 during the deposition process. Exposure to the UV light effectively increases an efficiency of removing the water, and the time of the UV curing operation is reduced. In yet embodiment, a dry annealing operation is performed on the ILD layer 236 after the UV curing operation. In some examples, the ILD layer 236 is annealed under a temperature of about 500° C. to about 800° C. for about 1 hour to about 4 hours in a nitrogen gas atmosphere. Performing the dry annealing operation may further remove the water from the ILD layer 236. In some embodiments, the third liner layer 234 is partially oxidized after the UV curing operation and/or the dry annealing is performed, and the other portion 234B remains. In some other embodiments, the third liner layer 234 is completely oxidized after the UV curing operation and/or the dry annealing is performed.

Because the water is not easily removed from the ILD layer 236 when the gaps 237 have a high aspect ratio (e.g. higher than 15), the third liner layer 234 plays an important role for removing the water and improving the quality of the ILD layer 236. Furthermore, reacting the surface 231 of the third liner layer 234 with the water (or absorbing the water using the third liner layer 234) may cause volume expansion of the third liner layer 234 that compresses the ILD layer 236, leading to a more compact ILD layer 236. In addition, the silicon element of the third liner layer 234 may diffuse into the oxide layer and compensates for the Si-deficient ILD layer 236 (i.e. a molar ratio of Si to O of the ILD layer 236 increases due to the diffusion of Si element of the third liner layer 234). The increase of the Si content in the ILD layer 236 may further improve the etching resistance of the ILD layer 236 to the typical etchants (e.g. DHF). Furthermore, the third liner layer 234 provides suitable surface energy for deposition of the ILD layer 236, which also results in a better gap-filling efficiency. Therefore, the quality of the ILD layer 236 (e.g. a mechanical strength, an insulating property, and an etching resistance) may be improved in existence of the third liner layer 234.

In some other embodiments, the ILD layer 236 may include silicon nitride, silicon oxynitride, TEOS, phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In these embodiments, the ILD layer 236 may be formed using, for example, ALD, spin-on-glass (SOG) or other suitable techniques.

The portions of the ILD layer 236, the third liner layer 234 and the CESL 232 on the top of the dummy gate stacks 220 are then removed. In some embodiments, removal of the portions of the ILD layer 236, the third liner layer 234 and the CESL 232 may include removing a portion of the ILD layer 236 by a CMP process to expose the CESL 232 and removing a top portion of the CESL 232 by an etching operation, followed by removing a top portion of the third liner layer 234 and another portion of the ILD layer 236 by another CMP process. After the CMP process, the third liner layer 234 is disposed between the dummy gate stack 220 and the ILD layer 236, and underlying a bottom of the ILD layer 236. In some embodiments, when the patterned mask used to form the dummy gate stacks 220 are not removed before the formation of the gate spacers 222, the patterned mask may be removed during the CMP process for planarizing the top portion of the third liner layer 234 and another portion of the ILD layer 236.

Figure 16A:
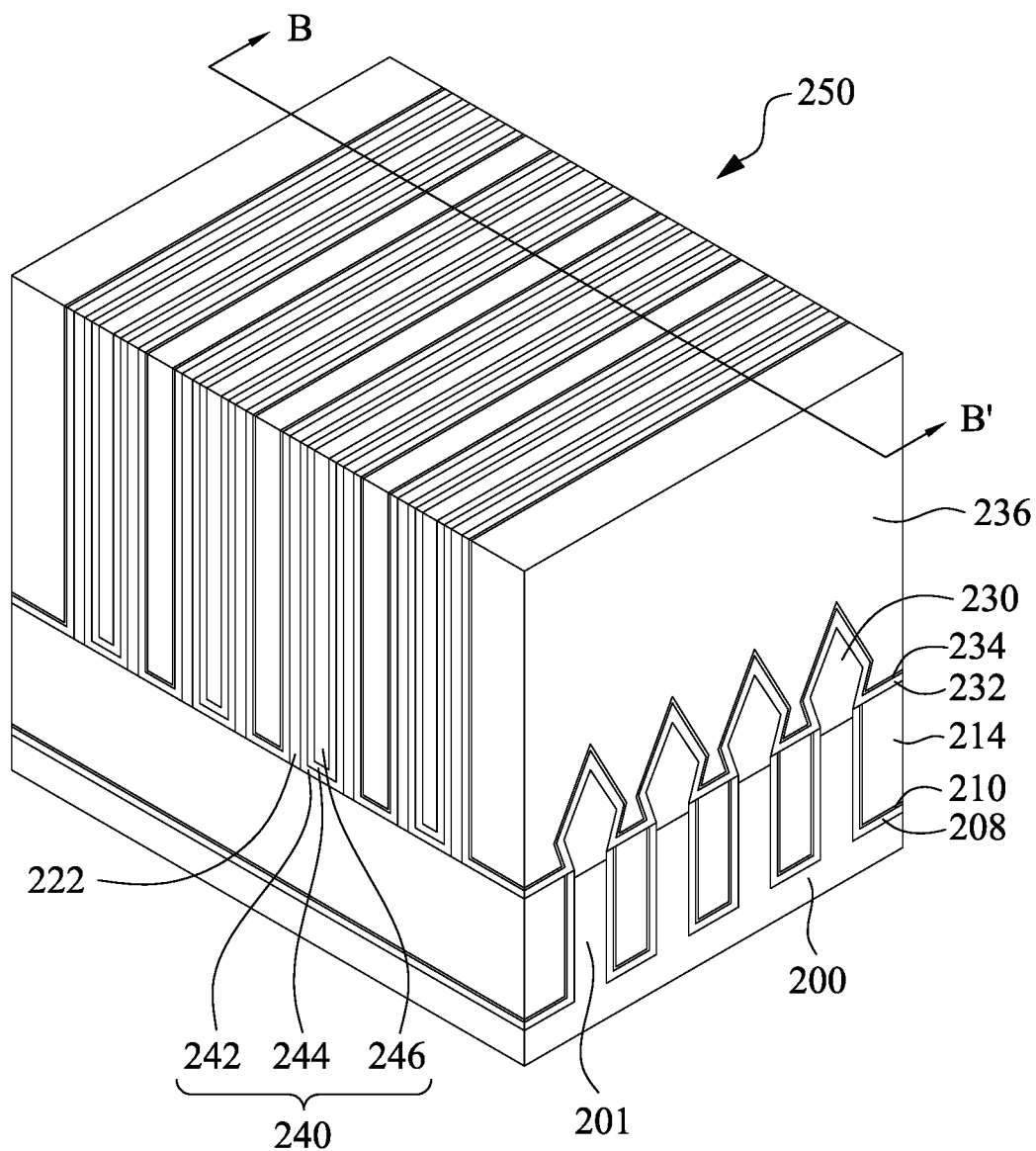
Figure 16B:
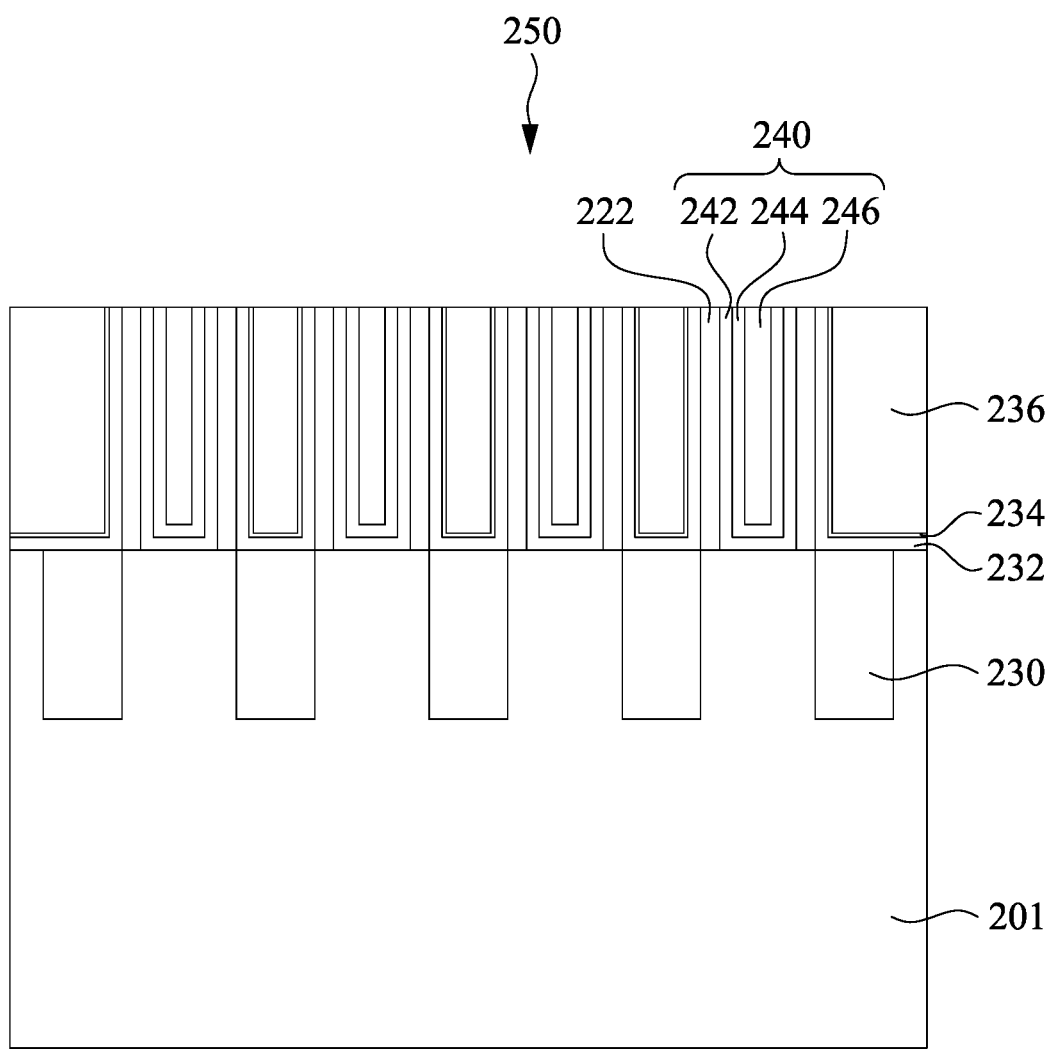

Reference is made to FIG. 1B, FIG. 16A and FIG. 16B. FIG. 16B is a cross-sectional view viewed along a cut line B-B' of FIG. 16A. At operation 128, the dummy gate stacks 220 are replaced with gate stacks 240, thereby forming a semiconductor device 250. In some embodiments, replacing the dummy gate stacks 220 includes removal of remaining dummy gate stacks 220. For example, dummy gate stacks 220 are removed to form gate trenches with the gate spacers 222 as their sidewalls. In some embodiments, the dummy gate stacks 220 are removed by performing a first etching process and performing a second etching process after the first etching process. In some embodiments, the dummy gate electrode layer 218 is mainly removed by the first etching process, and the gate dielectric layer 216 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W. In some embodiments, the dummy gate electrode layer 218 is removed, while the gate dielectric layer 216 remains in the gate trenches.

Then, the gate stacks 240 are formed in the gate trenches. Exemplary method of forming these gate stacks 240 may include blanket forming a layer of gate dielectric 242 in the gate trenches, forming one or more layers of work function conductor 244 over the blanket gate dielectric layer 242, forming a layer of filling conductor 246 over the one or more layers of work function conductor 244, and performing a CMP process to remove excessive materials of the filling conductor 246, the work function conductor 244 and the gate dielectric 242 outside the gate trenches.

In some embodiments, the gate dielectric 242 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric 242 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric 242 may have a multilayer structure such as one layer of silicon oxide (e.g., interfacial layer) and another layer of high-k material.

The work function conductor 244 over the gate dielectric 242 includes work function metals to provide a suitable work function for the metal gate stacks 240. In some embodiments, the work function conductor 244 may include one or more n-type work function metals (N-metal) for forming an n-type transistor on the substrate 200. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductor 244 may include one or more p-type work function metals (P-metal) for forming a p-type transistor on the substrate 200. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

The filling conductor 246 fills a recess in the work function conductor 244. The filling conductor 246 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 17:
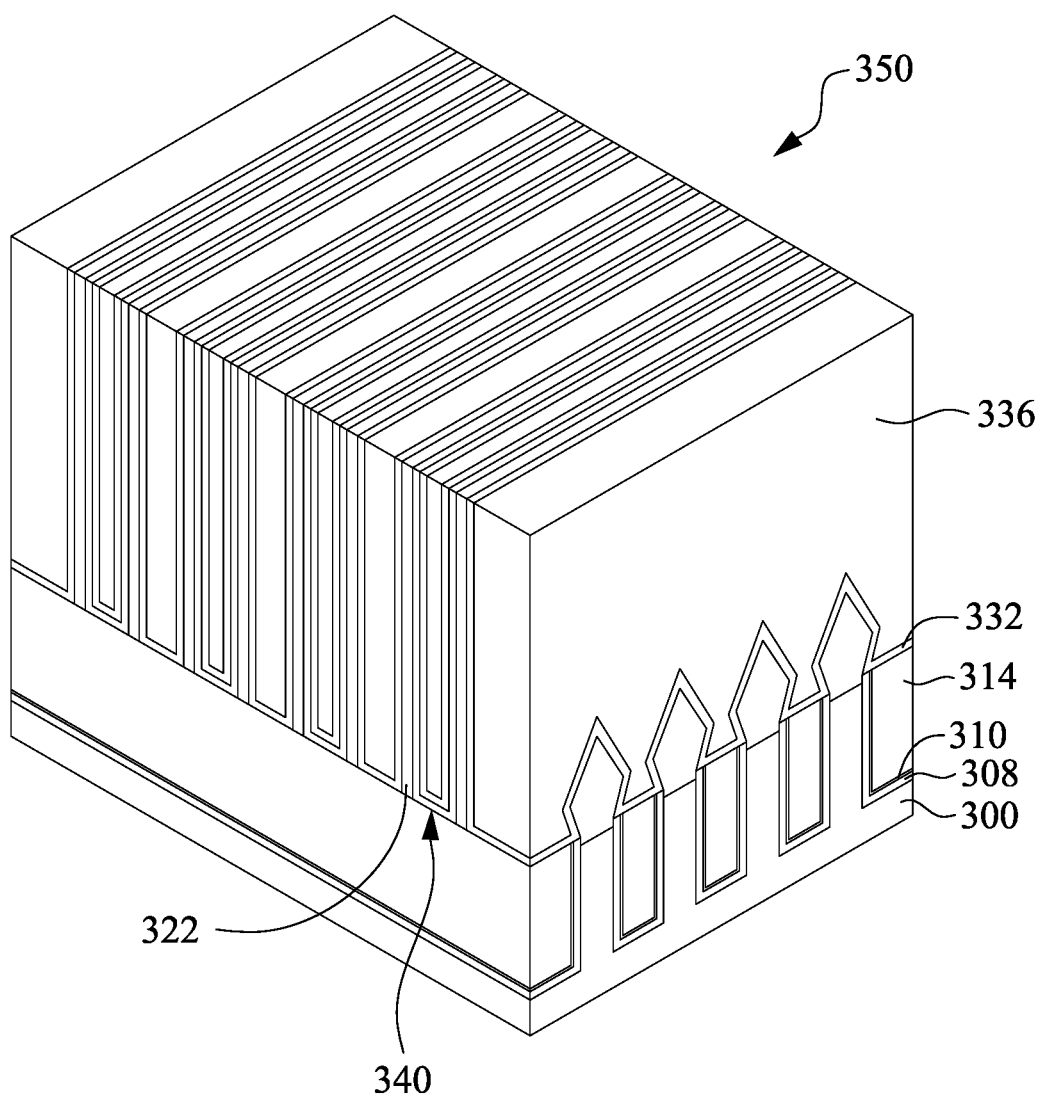
FIG. 17 is a schematic 3-D view of a semiconductor device in accordance with some embodiments of the present disclosure.

Please refer to FIG. 17. FIG. 17 is a schematic 3-D view of a semiconductor device in accordance with some embodiments of the present disclosure. As shown in FIG. 17, a semiconductor device 350 is provided. A substrate 300, a first liner layer 308, a second liner layer 310, trench isolations 314, gate spacers 322, a CESL 332, an ILD layer 336 and metal gate stacks 340 are respectively similar to those having similar reference numbers of the semiconductor device 250 shown in FIG. 16A and FIG. 16B, and may not be repeated herein. However, the semiconductor device 350 does not include a third liner layer formed between the ILD layer 336 and the CESL 332.

Figure 18:
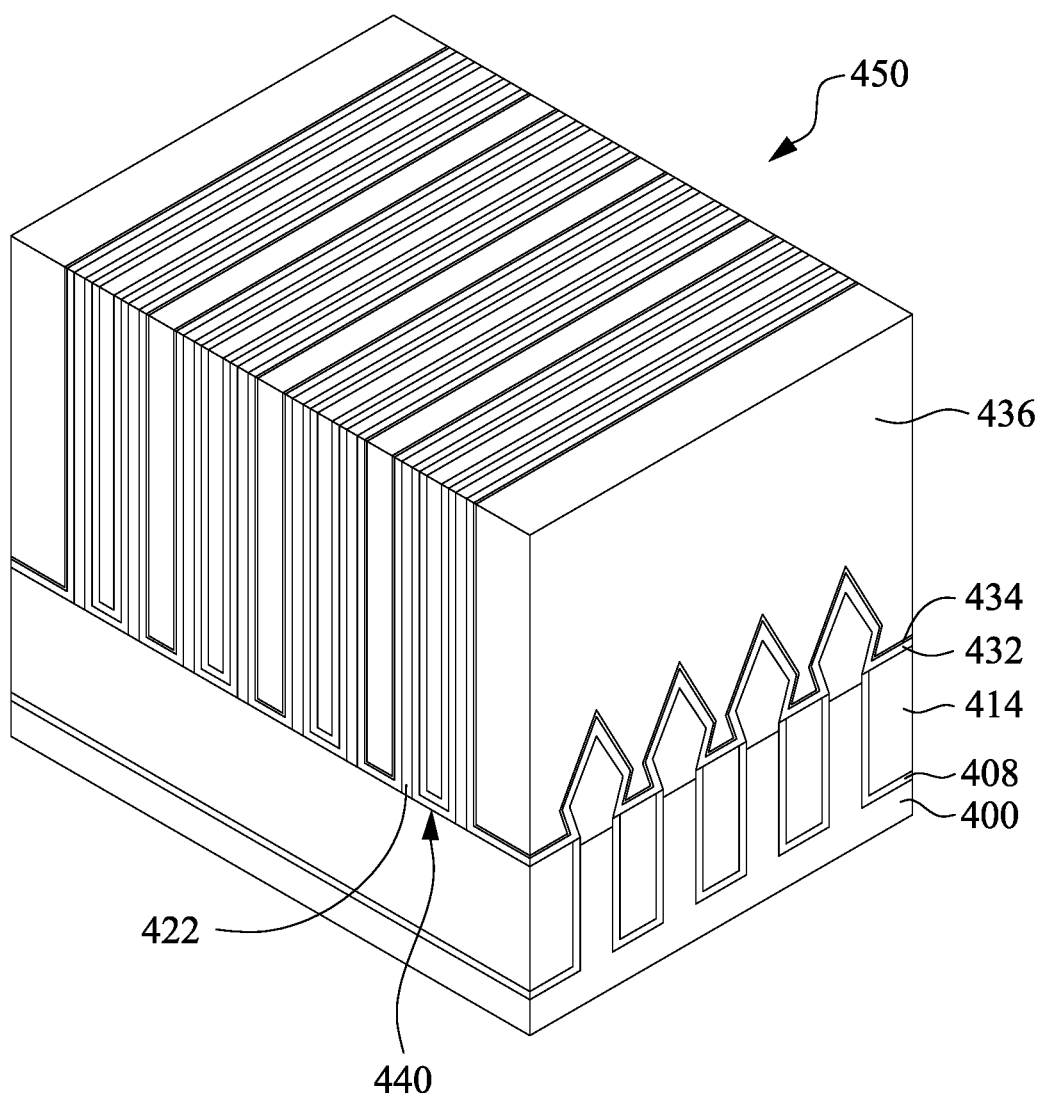
FIG. 18 is a schematic 3-D view of a semiconductor device in accordance with some embodiments of the present disclosure.

Please refer to FIG. 18. FIG. 18 is a schematic 3-D view of a semiconductor device in accordance with some embodiments of the present disclosure. As shown in FIG. 18, a semiconductor device 450 is provided. A substrate 400, a first liner layer 408, trench isolations 414, gate spacers 422, a CESL 432, a third liner layer 434, an ILD layer 436 and metal gate stacks 440 are respectively similar to those having similar reference numbers of the semiconductor device 250 shown in FIG. 16A and FIG. 16B, and may not be repeated herein. However, the semiconductor device 450 is lack of a second liner layer formed between the trench isolations 414 and the first liner layer 408.

Embodiments of the present disclosure may have at least following advantages. The additional Si liner layer (e.g. the second liner layer 210 and the third liner layer 234) is able to absorb the water remaining in the oxide layer 212 and the ILD layer 236, resulting in a reduced porosity of the structures of the oxide layer 212 and the ILD layer 236. Furthermore, the Si liner layer provides additional silicon elements to the oxide layer 212 and the ILD layer 236, and the surface energy of the Si liner layer is also advantageous to the deposition of the oxide layer 212 and the ILD layer 236. Therefore, the oxide layer 212 (i.e. the trench isolations 214) and the ILD layer 236 having the high aspect ratios may have sufficient mechanical strength, insulating property and etching resistance. In addition, a steam-free dry annealing operation reduces a thermal budget and decreases a diffusion impact on adjacent layers of the semiconductor device.

In some embodiments, a method is provided. Plural semiconductor fins are formed on a substrate, and plural trenches each of which is formed between two adjacent semiconductor fins. A silicon liner layer is deposited to be conformal to the semiconductor fins and the trenches. The silicon liner layer is deposited by using a silane compound. Then, an oxide layer is deposited on the silicon liner layer to fill the trenches and cover the semiconductor fins, in which depositing the oxide layer forms water in the oxide layer. Next, a surface of the silicon liner layer is reacted with the water, so as to remove the water from the oxide layer.

In some embodiments, a method is provided. Plural semiconductor fins are formed on a substrate. Trench isolations are formed between every two adjacent semiconductor fins. Plural dummy gate stacks are formed crossing the semiconductor fins. Gate spacers are formed on sidewalls of the dummy gate stacks. A first silicon liner layer is formed to be conformal to the gate spacers, the dummy gate stacks and the substrate. An inter-layer dielectric (ILD) layer is formed on the first silicon liner layer, in which forming the ILD layer forms water in the ILD layer. A surface of the first silicon liner layer is reacted with the water to remove the water from the ILD layer. Each of the dummy gate stacks is replaced with a gate stack.

In some embodiments, a semiconductor device is provided. The semiconductor device includes a substrate with a semiconductor fin having an upper portion and a lower portion adjoining the upper portion, and a trench isolation covering sidewalls of the lower portion of the semiconductor fin. The semiconductor device further includes a gate stack crossing the upper portion of the semiconductor fin, and a gate spacer formed on sidewalls of the gate stack. The semiconductor device further include an inter-layer dielectric (ILD) layer covering sidewalls of the gate spacer, and one of a first silicon liner layer and a second silicon liner layer. The first silicon liner layer is disposed between the substrate and the trench isolation. The second silicon liner layer is disposed between the gate stack and the ILD layer and underlies a bottom of the ILD layer. Each of the first and second silicon liner layers has a first portion and a second portion underlying the first portion. The first portion of the first silicon liner layer contacts the trench isolation. The first portion of the second silicon liner layer contacts the ILD layer. The first portion of each of the first and second silicon liner layers comprises silicon oxide that is different from the second portion of each of the first and second silicon liner layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of semiconductor fins on a substrate;
   forming trench isolations between every two adjacent semiconductor fins;
   forming a plurality of dummy gate stacks crossing the semiconductor fins;
   forming gate spacers on sidewalls of the dummy gate stacks;
   forming a first silicon liner layer conformal to the gate spacers, the dummy gate stacks and the substrate;
   forming an inter-layer dielectric (ILD) layer on the first silicon liner layer, wherein forming the ILD layer forms water in the ILD layer;
   reacting a surface of the first silicon liner layer with the water to remove the water from the ILD layer such that a first portion of the first silicon liner layer is converted into a silicon oxide layer, and a second portion of the first silicon liner layer is remained under the first portion of the first silicon liner layer, wherein a thickness of the second portion of the first silicon liner layer is greater than a thickness of the first portion of the first silicon liner layer;
   performing a steam-free annealing process on the ILD layer; and
   replacing each of the dummy gate stacks with a gate stack.

2. The method of claim 1, further comprising forming a contact etch stop layer (CESL) on the gate spacers and the dummy gate stacks before the silicon liner layer is formed.

3. The method of claim 1, further comprising forming a second silicon liner layer conformal to the semiconductor fins over the substrate before the trench isolations are formed.

4. The method of claim 3, further comprising forming a trench isolation liner layer on the semiconductor fins before the second silicon liner layer is formed.

5. The method of claim 4, wherein forming the trench isolations comprises:
   depositing an oxide layer on the trench isolation liner layer and the second silicon liner layer to cover the semiconductor fins, wherein depositing the oxide layer forms the water in the oxide layer;
   reacting a surface of the second silicon liner layer with the water so as to remove the water from the oxide layer; and
   removing portions of the oxide layer, the isolation trench liner layer and the second silicon liner layer to expose the semiconductor fins.

6. The method of claim 1, wherein forming the ILD layer is performed by FCVD using an alkoxysilane and an oxygen-containing species as precursors.

7. The method of claim 6, wherein reacting the surface of the first silicon liner layer with the water comprises performing an UV curing operation at a temperature in a range substantially from 200° C. to 500° C. after the FCVD is performed.

8. The method of claim 5, wherein reacting the surface of the first silicon liner layer with the water comprises converting the surface of the first silicon liner layer into silicon oxide.

9. The method of claim 1, wherein after reacting the surface of the first silicon liner layer with the water, an interface between the ILD layer and the silicon oxide layer is formed.

10. A method, comprising:
   forming a plurality of semiconductor fins on a substrate;
   forming trench isolations laterally surrounding lower portions of the semiconductor fins;
   forming a first dummy gate stack and a second dummy gate stack extending across upper portions of the semiconductor fins;
   forming gate spacers on sidewalls of the first and second dummy gate stacks;
   depositing a first semiconductive silicon liner layer on the gate spacers, the first and second dummy gate stacks and the substrate, wherein the first semiconductive silicon liner layer comprises a first portion covering the first dummy gate stack, a second portion covering the second dummy gate stack, and a third portion interconnecting the first and second portions;
   depositing an inter-layer dielectric (ILD) layer on the first semiconductive silicon liner layer using a flowable chemical vapor deposition (FVCD) process, wherein the FCVD process results in water in the ILD layer;
   after the FVCD process, performing an UV curing operation at a temperature in a range substantially from 200° C. to 500° C. such that the first semiconductive silicon liner layer absorbs the water resulted from the FCVD process; and
   replacing each of the dummy gate stacks with a gate stack.

11. The method of claim 10, further comprising performing a dry annealing operation on the ILD layer after the UV curing operation is performed.

12. The method of claim 10, wherein absorbing the water resulted from the FCVD comprises converting at least a part of the first semiconductive silicon liner layer into silicon oxide.

13. The method of claim 10, wherein depositing the first semiconductive silicon liner layer is performed by epitaxial growth or low-pressure chemical vapor deposition.

14. The method of claim 10, further comprising depositing a contact etching stop layer (CESL) on the gate spacers and the first and second dummy gate stacks before the first semiconductive silicon liner layer is formed.

15. The method of claim 14, wherein the CESL is formed from silicon nitride, and a content of nitrogen of the first semiconductive silicon liner layer is less than that of the CESL.

16. The method of claim 14, wherein the CESL is formed from silicon oxynitride, and a content of nitrogen and a content of oxygen of the first semiconductive silicon liner layer are both less than those of the CESL.

17. A method, comprising:
   forming a plurality of semiconductor fins on a substrate;
   forming trench isolations laterally surrounding lower portions of the semiconductor fins;
   forming a plurality of dummy gate stacks across upper portions of the semiconductor fins;
   forming gate spacers on sidewalls of the dummy gate stacks;
   forming a source/drain epitaxial structure between the gate spacers;
   forming a contact etch stop layer (CESL) conformal to the gate spacers, the dummy gate stacks, the source/drain epitaxial structure and the substrate;
   depositing a first silicon liner layer conformal to the CESL;
   depositing an inter-layer dielectric (ILD) layer on the first silicon liner layer using a flowable chemical vapor deposition (FCVD) process, wherein the FCVD process results in water in the ILD layer;
   after the FCVD process, performing a dry annealing process to remove the water resulting from the FCVD process such that the CESL is directly between a portion of the first silicon liner layer and the source/drain epitaxial structure after the dry annealing process; and
   replacing each of the dummy gate stacks with a gate stack.

18. The method of claim 17, wherein the CESL is formed from silicon nitride, silicon oxynitride or a combination thereof.

19. The method of claim 17, wherein a content of nitrogen of the first silicon liner layer is less than 1 at. %.

20. The method of claim 17, wherein a content of oxygen of the first silicon liner layer is less than 1 at. %.

* * * * *